(12) United States Patent
Liaw

(10) Patent No.: US 9,236,300 B2
(45) Date of Patent: Jan. 12, 2016

(54) CONTACT PLUGS IN SRAM CELLS AND THE METHOD OF FORMING THE SAME

(71) Applicant: Taiwan Semiconductor Manufacturing Company, Ltd., Hsin-Chu (TW)

(72) Inventor: Jhon-Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 67 days.

(21) Appl. No.: 13/691,367

(22) Filed: Nov. 30, 2012

(65) Prior Publication Data

US 2014/0151812 A1 Jun. 5, 2014

(51) Int. Cl.
| | |
|---|---|
| *H01L 21/302* | (2006.01) |
| *H01L 21/461* | (2006.01) |
| *H01L 21/768* | (2006.01) |
| *H01L 27/02* | (2006.01) |
| *H01L 27/11* | (2006.01) |

(52) U.S. Cl.
CPC .... *H01L 21/76895* (2013.01); *H01L 21/76816* (2013.01); *H01L 27/0207* (2013.01); *H01L 27/1108* (2013.01); *H01L 2924/0002* (2013.01)

(58) Field of Classification Search
CPC .................. H01L 224/03474; H01L 224/3902; H01L 224/11902; H01L 224/11903; H01L 224/27902; H01L 11/27903; H01L 27/1288; H01L 21/32139; H01L 21/31116
USPC ......... 438/717, 734, 736, 738–740, 742–744, 438/749–751
See application file for complete search history.

(56) References Cited

U.S. PATENT DOCUMENTS

| | | | |
|---|---|---|---|
| 4,623,989 | A | 11/1986 | Blake |
| 6,522,562 | B2 | 2/2003 | Foss |

(Continued)

FOREIGN PATENT DOCUMENTS

| | | |
|---|---|---|
| KR | 1020100080171 | 2/2012 |
| TW | 201128736 | 8/2011 |

OTHER PUBLICATIONS

Taiwan Patent Office, "Office Action" for Application No. 10420454810, mailed Apr. 10, 2015, 7 pages.

(Continued)

*Primary Examiner* — Mamadou Diallo
*Assistant Examiner* — Jay C Chang
(74) *Attorney, Agent, or Firm* — Haynes and Boone, LLP

(57) ABSTRACT

A method includes forming a dielectric layer over a portion of an SRAM cell. The SRAM cell includes a first pull-up transistor and a second pull-up transistor, a first pull-down transistor and a second pull-down transistor forming cross-latched inverters with the first pull-up transistor and the second pull-up transistor, and a first pass-gate transistor and a second pass-gate transistor connected to drains of the first pull-up transistor and the first pull-down transistor and drains of the second pull-up transistor and the second pull-down transistor, respectively. A first mask layer is formed over the dielectric layer and patterned. A second mask layer is formed over the dielectric layer and patterned. The dielectric layer is etched using the first mask layer and the second mask layer in combination as an etching mask, wherein a contact opening is formed in the dielectric layer. A contact plug is formed in the contact opening.

20 Claims, 30 Drawing Sheets

(56) References Cited

U.S. PATENT DOCUMENTS

| | | | |
|---|---|---|---|
| 7,674,703 B1* | 3/2010 | Schiwon et al. | 438/618 |
| 2004/0170926 A1* | 9/2004 | Chandhok | 430/311 |
| 2007/0231750 A1* | 10/2007 | Parikh | 430/316 |
| 2007/0235765 A1* | 10/2007 | Liaw | 257/207 |
| 2008/0299780 A1* | 12/2008 | Elliott et al. | 438/770 |
| 2011/0111348 A1* | 5/2011 | Schultz | 430/312 |
| 2012/0142179 A1* | 6/2012 | Park et al. | 438/586 |

OTHER PUBLICATIONS

Korean Intellectual Property Office, Korean Notice of Allowance dated Jun. 17, 2015 for Application No. 1020130020416, 3 pages.

* cited by examiner

CONTACT PLUGS IN SRAM CELLS AND THE METHOD OF FORMING THE SAME

BACKGROUND

In deep micro technology, the sizes of contact plugs continue to shrink to fit the increasingly reduced gate pitches. To shrink the contact sizes without incurring impact on contact resistance, long contact plugs, as compared to square contact plugs, were adopted. By adopting long contact plugs, the widths of contact plugs, which widths are measured in gate-pitch direction, may be reduced. The long contact plugs have greater lengths, which are measured in gate-routing (gate lengthwise) direction. By using long contact plugs, both active contact sizes and lithography exposure areas are increased.

The long contact plugs can achieve both high gate density and low contact resistance. Concern, however, still exists. For example, line-end shortening and/or line-end to line-end bridging may occur at the ends of neighboring long contact plugs. These may result in either contact-to-fin active opening (also known as contact shortening) or contact-to-contact leakage (caused by contact bridging). To reduce the probability of the line-end shortening, a more limiting space rule is needed to increase the spacing between the ends of neighboring contact plugs, or a more aggressive Optical Proximity Correction (OPC) is needed at line ends. These solutions, however, impact the sizes of integrated circuits. The problem may become worse in future fin-type MOSFETs (3D MOSFETs) since 3D MOSFETs have very narrow active regions.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Static Random Access Memory (SRAM) cell is provided in accordance with various exemplary embodiments. The variations of the embodiments are discussed. Throughout the various views and illustrative embodiments, like reference numbers are used to designate like elements. Although six-transistor (6T) SRAM cells are used as examples to explain the concept of the embodiments, the embodiments is readily applicable to other SRAM cells having different number of transistors, such as 8T SRAM cells.

Figure 1A:
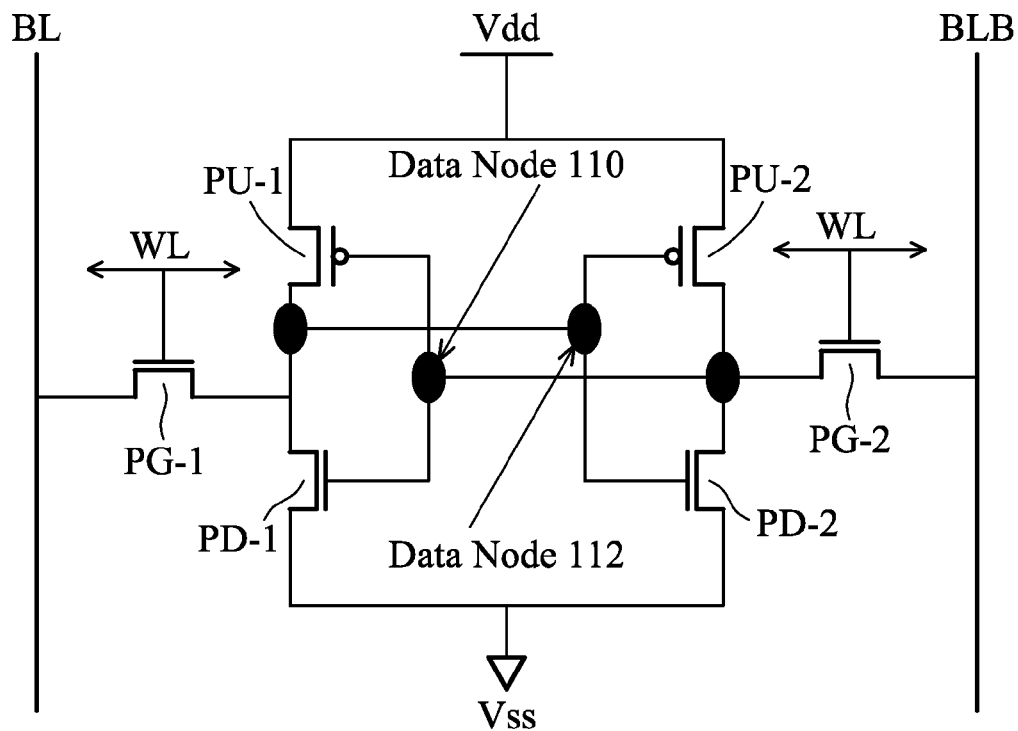
FIGS. 1A and 1B are circuit diagrams of a Static Random Access Memory (SRAM) cell in accordance with exemplary embodiments.

FIG. 1A illustrates a circuit diagram of SRAM cell 10 in accordance with some embodiments. SRAM cell 10 includes pass-gate transistors PG-1 and PG-2 and pull-up transistors PU-1 and PU-2, which are P-type Metal-Oxide-Semiconductor (PMOS) transistors, and pull-down transistors PD-1 and PD-2, which are N-type Metal-Oxide-Semiconductor (NMOS) transistors. The gates of pass-gate transistors PG-1 and PG-2 are connected to word-line WL that determines whether SRAM cell 10 is selected or not. A latch formed of pull-up transistors PU-1 and PU-2 and pull-down transistors PD-1 and PD-2 stores a bit, wherein the complementary values of the bit are stored in data node 110 and data node 112. The stored bit can be written into, or read from, SRAM cell 10 through bit lines BL and BLB.

The sources of pull-up transistors PU-1 and PU-2 are connected to voltage node Vdd, which carries positive power supply voltage (and line) Vdd. The sources of pull-down transistors PD-1 and PD-2 are connected to power supply voltage (and line) Vss, which are further connected to power supply voltage/line Vss (an electrical ground, for example). The gates of transistors PU-1 and PD-1 are connected to the drains of transistors PU-2 and PD-2, which connection node is data node 110. The gates of transistors PU-2 and PD-2 are connected to the drains of transistors PU-1 and PD-1, which connection node is data node 112. A source/drain region of pass-gate transistor PG-1 is connected to bit-line BL. A source/drain region of pass-gate transistor PG-2 is connected to bit-line BLB.

Figure 1B:
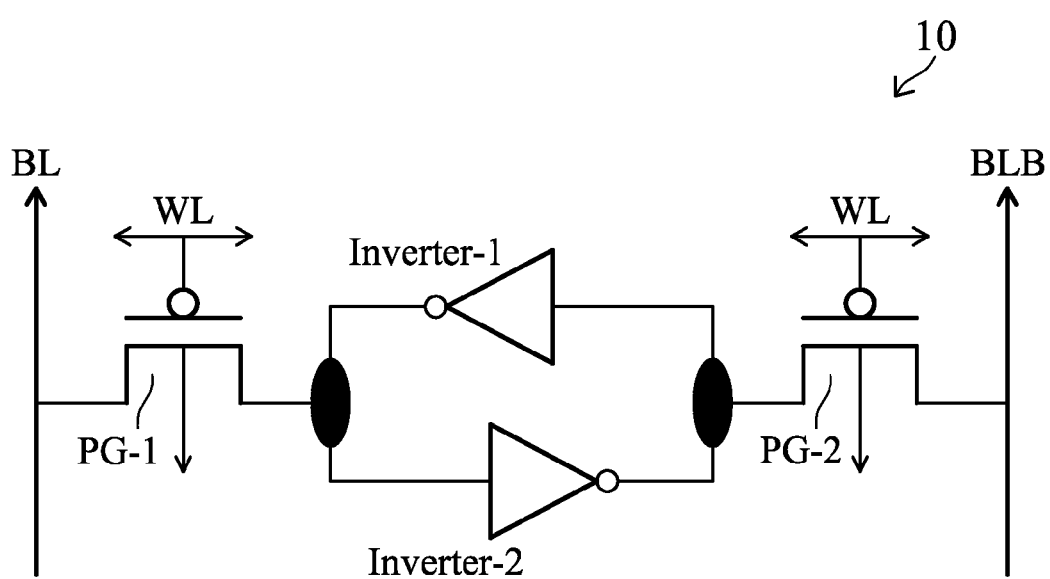

FIG. 1B illustrates a an alternative circuit diagram of SRAM cell 10, wherein transistors PU-1 and PD-1 in FIG. 1A are represented as first inverter Inverter-1, and transistors PU-2 and PD-2 are represented as second inverter Inverter-2. The output of first inverter Inverter-1 is connected to transistor PG-1 and the input of the second inverter Inverter-2. The output of second inverter Inverter-2 is connected to transistor PG-2 and the input of second inverter Inverter-2.

Figure 2:
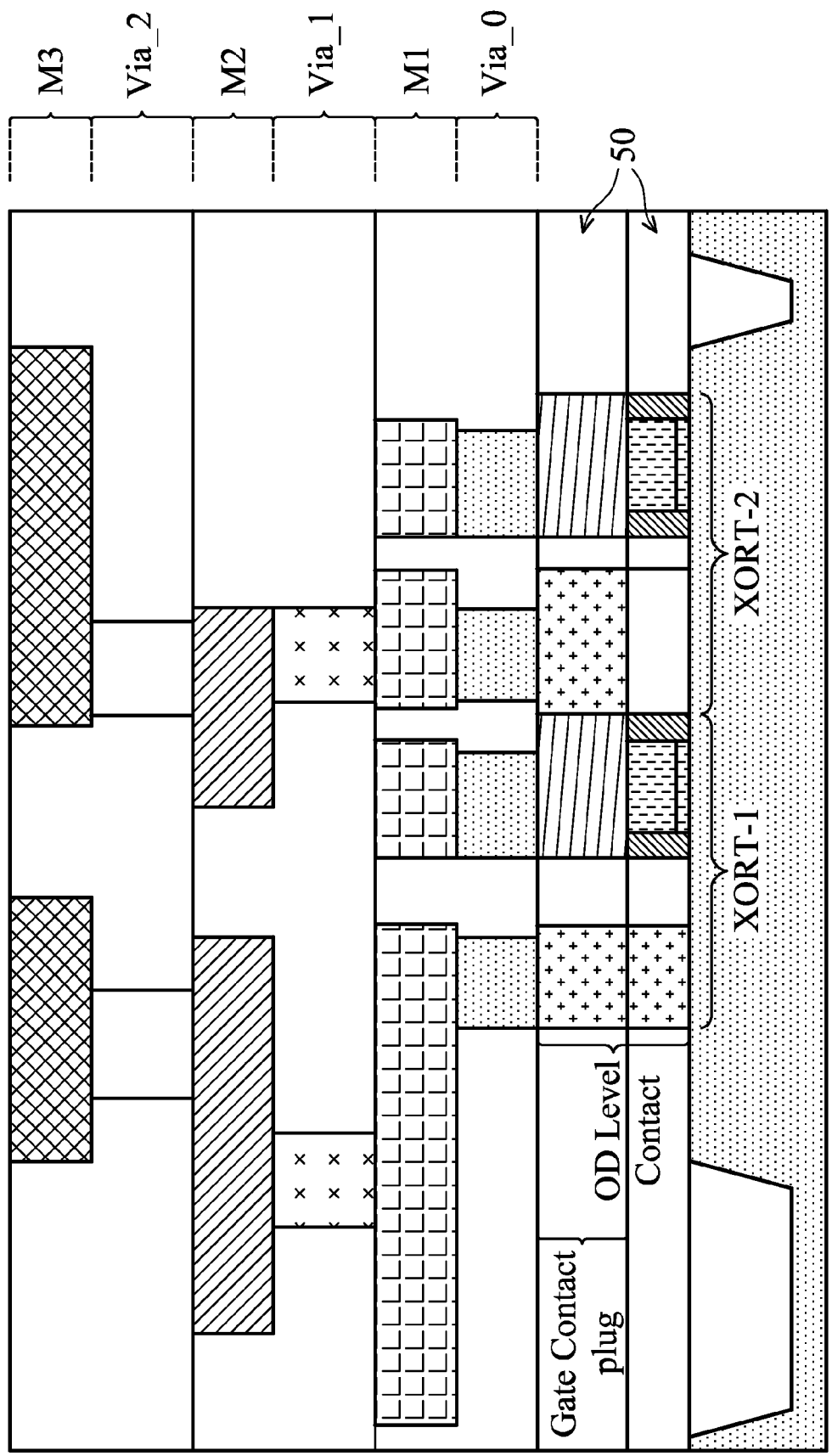
FIG. 2 illustrates a schematic cross-sectional view illustrating layers of an SRAM cell.

FIG. 2 illustrates a schematic cross-sectional view of SRAM cell 10, which layers are formed on a semiconductor chip or wafer. It is noted that FIG. 2 is schematically illustrated to show various layers of interconnect structure and transistors, and may not reflect the actual cross-sectional view of SRAM cell 10. The interconnect structure includes gate contact level, an OD (wherein the term "OD" represents "active region") level, via levels Via_0, Via_1, and Via_2, and metal layers M1, M2, and M3. Each of the levels includes one or more dielectric layers and the conductive features formed therein. The conductive features that are at the same level may have top surfaces substantially level to each other, bottom surfaces substantially level to each other, and may be formed simultaneously. The features in the gate contact level connects gate electrodes of transistors (such as the illustrated exemplary transistors PU-1 and PU-2) to an overlying level such as the Via_0 level. The features in the OD level connects source and drain regions of transistors, pickup regions of well regions, and the like to an overlying level such as the Via_0 level.

Figure 3A:
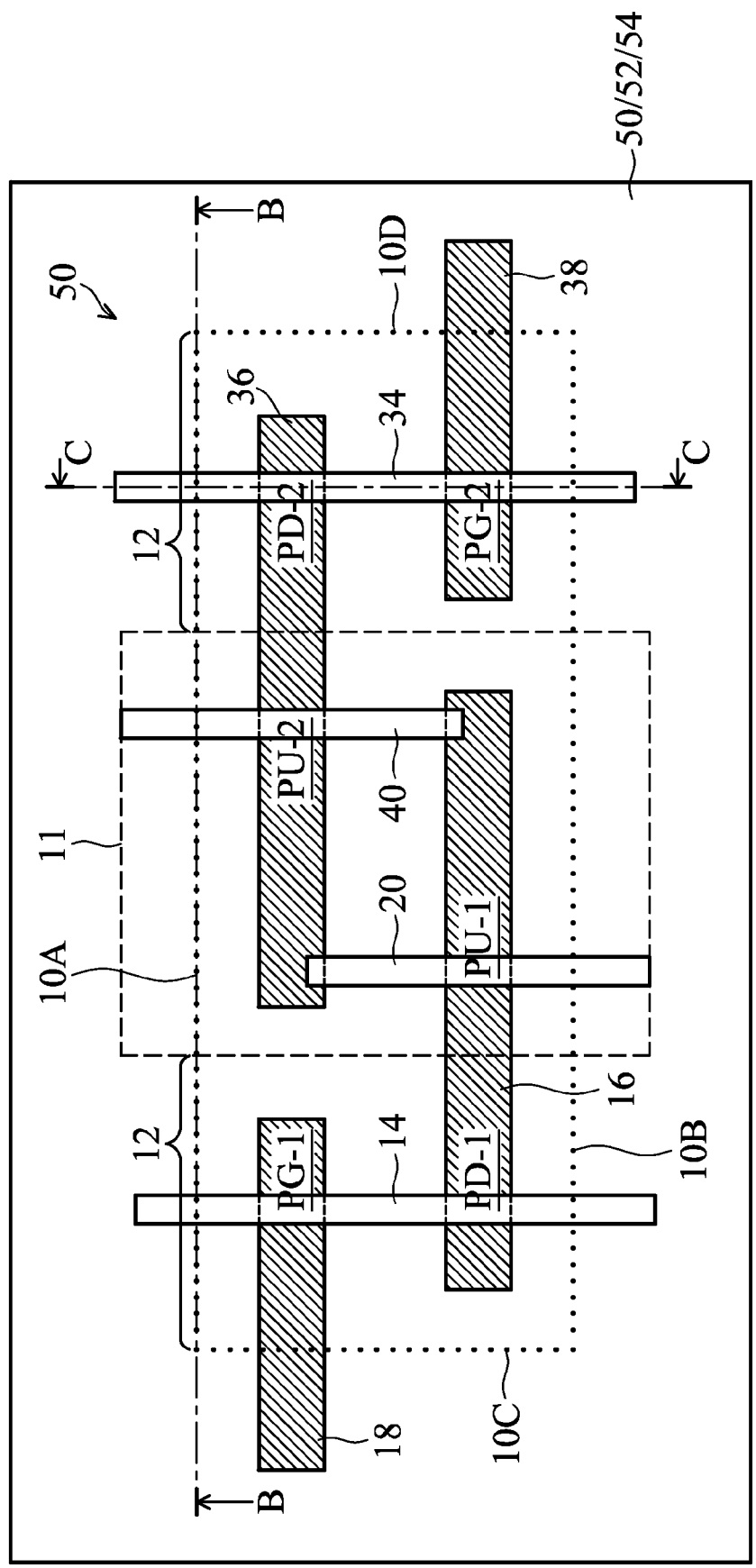
FIGS. 3A-10 are top views and cross-sectional views of intermediate stages in the formation of an SRAM cell in accordance with various embodiments.

FIG. 3 illustrates a layout of SRAM cell 10 in accordance with exemplary embodiments. In some embodiments, the layout has a Graphic Database System (GDS) format, and may be embodied on a tangible non-transitory storage medium such as a hard disk. The layout may be accessed and processed by a computer. Furthermore, the patterns in the layouts and the process steps as illustrated throughout the description may be formed on lithography masks that have transparent and opaque patterns, which lithography masks are used to exposed photo resists, so that the features as illustrated throughout the description are formed to have the illustrated patterns (shapes). Accordingly, the layouts in the present disclosure may also represent lithography masks incorporating the patterns shown in the respective layout. For example, patterns 56 and 60 in FIG. 7A are also layout patterns in layouts. Furthermore, FIG. 3A also represents a top view of a circuit structure that is formed on a semiconductor wafer. In FIGS. 3A through 10, process steps for forming SRAM cell 10 is discussed in accordance with some exemplary embodiments.

Referring to FIG. 3A, the outer boundaries of SRAM cell 10 are illustrated using dashed lines 10A, 10B, 10C, and 10D, which form a rectangle. N-well region 11 is formed between two p-well regions 12. Gate electrode 16 forms pull-up transistor PU-1 with the underlying active region 20, which may be a portion of n-well region 11, and may be fin-based. Gate electrode 16 further forms pull-down transistor PD-1 with the underlying active region 14, which may be a portion of p-well region 12. Gate electrode 18 forms pass-gate transistor PG-1 with the underlying active region 14. Gate electrode 36 forms pull-up transistor PU-2 with the underlying active region 40, which may be a portion of n-well region 11. Gate electrode 36 further forms pull-down transistor PD-2 with the underlying active region 34, which may be a portion of p-well region 12. Gate electrode 38 forms pass-gate transistor PG-2 with the underlying active region 34. Active regions 14, 20, 34, and 40 may be semiconductor fins (which are long strips) in accordance with some embodiments. Transistors PG-1 and PG-2, PU-1 and PU-2, and PD-1 and PD-2 may be Fin Field-Effect Transistors (FinFETs) in accordance with some embodiments.

Figure 3B:
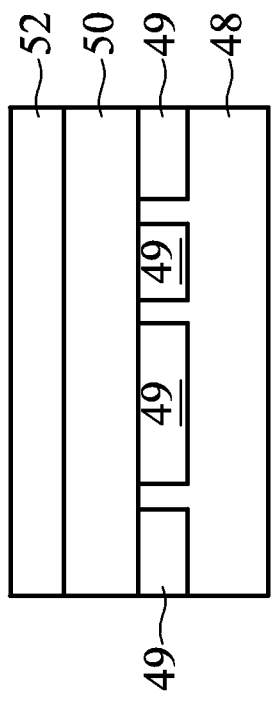
Figure 3C:
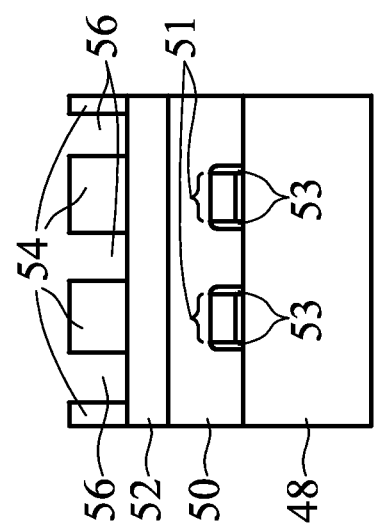

Over transistors PU-1, PU-2, PD-1, PD-2, PG-1, and PG-2, a dielectric layer or a plurality of dielectric layers 50 are formed. Dielectric layer 50 is also shown in FIGS. 3B and 3C, which are cross-sectional views obtained from the planes crossing lines B-B and C-C, respectively, in FIG. 3A. Referring to FIGS. 3B and 3C, in some embodiments, dielectric layer(s) 50 include Inter-layer Dielectric (ILD) layer 50, which is formed to cover the source and drain regions of transistors PU-1, PU-2, PD-1, PD-2, PG-1, and PG-2 (FIG. 3A). The source and drain regions may be fin portions of active regions 14, 20, 34, and 40 in FIG. 3A. Furthermore, ILD layer 50 is illustrated in FIG. 2, wherein Transistors XORT1 and XORT2 are schematically illustrated to represent transistors PU-1, PU-2, PD-1, PD-2, PG-1, and PG-2. Over ILD 50, hard mask layer 52 is formed as a blanket layer, as also shown in FIGS. 3B and 3C.

As shown in FIGS. 3B and 3C, dielectric layer 50 is formed over semiconductor substrate 48, which may be a silicon substrate, although other semiconductor materials such as silicon germanium, silicon carbon, III-V compound semiconductor materials, or the like, may be comprised in substrate 48. FIG. 3B illustrates that insulation regions such as Shallow Trench Isolation (STI) regions 49 are formed in semiconductor substrate 48. In FIG. 3C, gate stacks 51 are illustrated, wherein gate stacks 51 represent the gate stacks of transistors PG-2 and PD-2 (FIG. 3A). Gate spacers 53 are formed on the sidewalls of gate stacks 51. ILD 50 is formed of a dielectric material, which may be a low-k dielectric material having a dielectric constant (k value) lower than about 3.0, although dielectric material having higher k values may also be used. For example, dielectric layer 50 may comprise silicon oxide based dielectric materials such as Phospho-Silicate Glass (PSG), Boro-Silicate Glass (BSG), Boron-Doped Phospho-Silicate Glass (BPSG), Tetraethyl Orthosilicate (TEOS) oxide, or the like. Dielectric layer 50 may also comprise a material selected from silicon oxynitride, silicon nitride, a carbon-containing dielectric, and a nitrogen-containing dielectric.

Hard mask layer 52 is formed over dielectric layer 50, and is formed of a material that has an adequate etching selectivity from ILD 50, so that in subsequent process steps, hard mask layer 52 may be patterned and removed without causing significant damage to dielectric layer 50. In some exemplary embodiments, hard mask layer 52 comprises a material selected from the a silicon oxide based dielectric, silicon oxynitride, silicon nitride, polysilicon, amorphous silicon, a carbon-containing dielectric, a nitrogen-containing dielectric, an organic material, a refractory metal, and combinations thereof.

Figure 4:
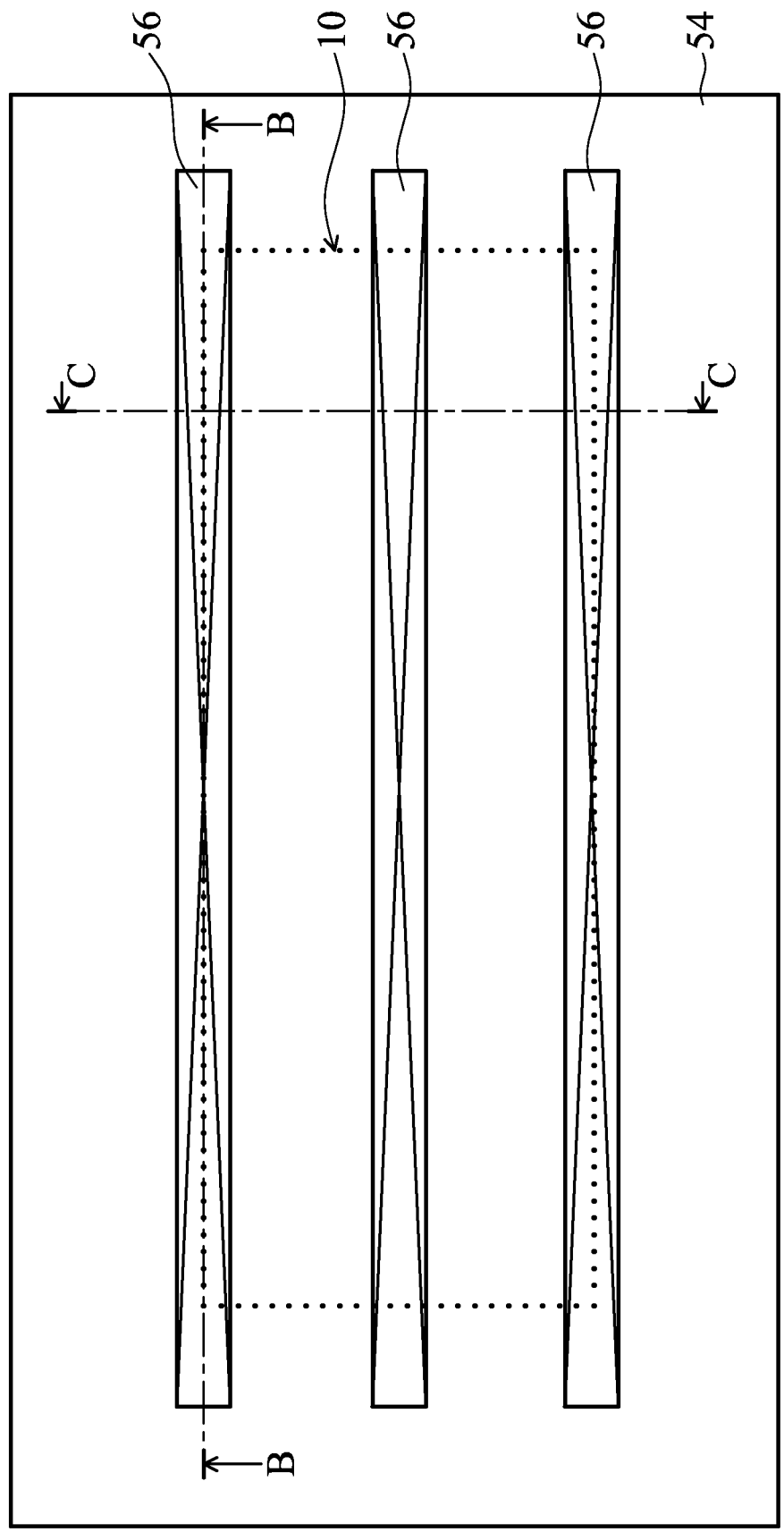

Over hard mask layer 52, photo resist 54, which is illustrated in FIG. 3C, is formed and patterned to form long openings 56 therein. The formation of photo resist 54 may include printing or spin coating. The patterning of photo resist 54 may include an exposure using a light with a wavelength equal to, for example, 193 nm (an ArF light), an e-beam, or an Extreme Ultra-Violet (EUV) light. FIG. 4 illustrates a top view of the patterned photo resist 54, which includes a plurality of long openings 56 therein. The cell boundaries 10A, 10B, 10C, and 10D are illustrated to show the positions of exemplary openings 56 with relative to the position of cell boundaries 10A, 10B, 10C, and 10D. In some embodiments, photo resist openings 56 are parallel to the long boundaries 10A and 10B, and extend all the way from short boundary 10C to short boundary 10D, wherein short boundaries 10C and 10D are shorter than long boundaries 10A and 10B. Photo resist openings 56 may be parallel to each other. Furthermore, some photo resist openings 56 may overlap cell boundaries 10A and 10B.

Figure 5:
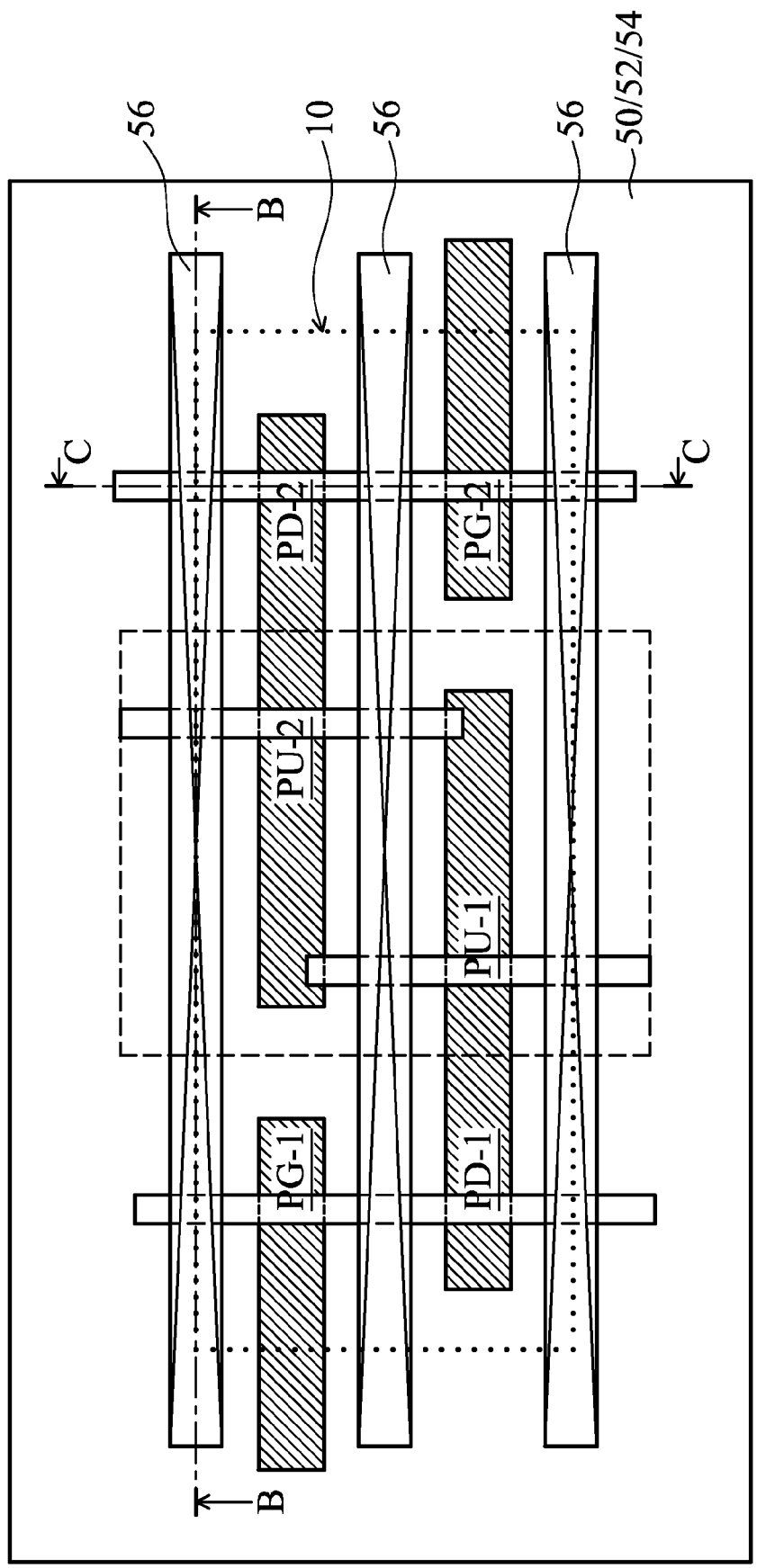

FIG. 5 is a figure that includes patterned photo resist 54 and the underlying transistors PU-1, PU-2, PD-1, PD-2, PG-1, and PG-2. FIGS. 4 and 5 show that, in accordance with some exemplary embodiments, the patterned photo resist 54 is formed as a blanket layer, except that photo resist openings 56 are formed to expose underlying features.

Figure 6A:
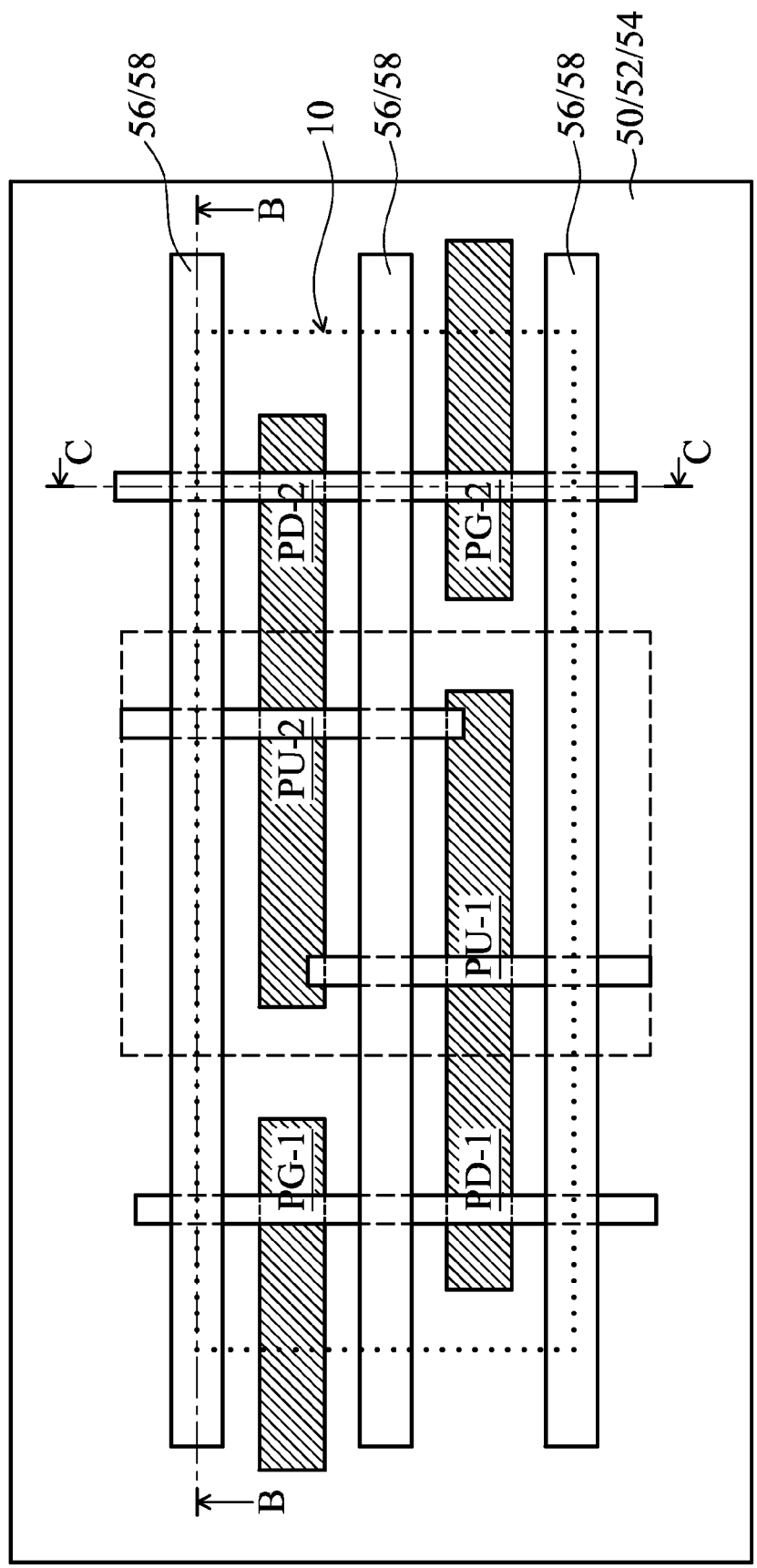
Figure 6B:
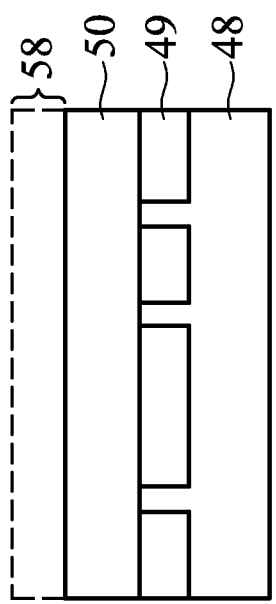
Figure 6C:
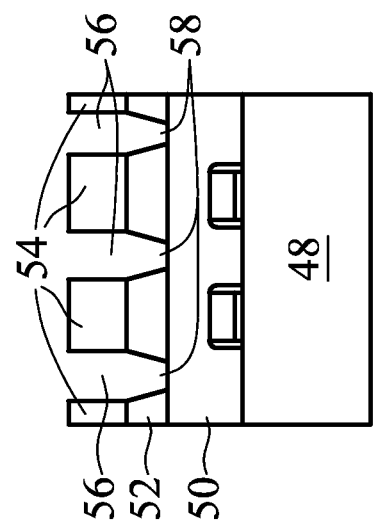
Figure 7A:
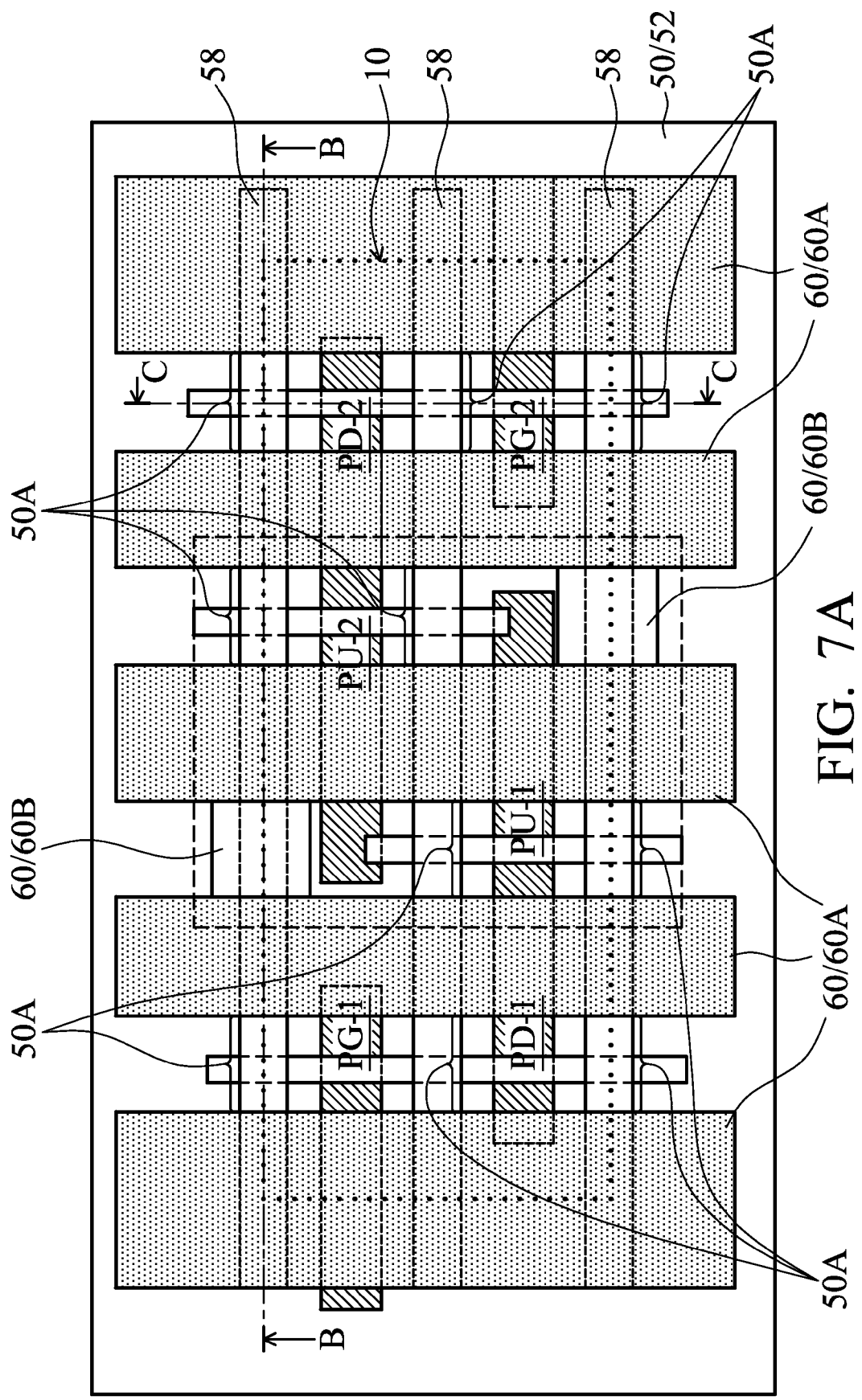

Next, an etching step is performed on hard mask layer 52 using photo resist 54 as an etching mask, so that openings 58 are formed in hard mask layer 52, as shown in FIGS. 6A, 6B, and 6C. FIG. 6A illustrate a top view, which is similar to the top view in FIG. 5, except that openings 58 are now formed. Openings 58 are aligned to photo resist openings 56. FIGS. 6B and 6C are cross-sectional views obtained from the planes crossing lines B-B and C-C, respectively, in FIG. 6A. FIG. 6B illustrates the plane of photo resist opening 56, and hence photo resist 54 is not shown in the plane. In FIG. 6C, three openings 58 are illustrated as being aligned to the overlying photo resist openings 56. As shown in FIG. 6A, dielectric layer 50 includes some portions overlapping some source/drain portions of semiconductor fins 14, 20, 34, and 40, which portions of dielectric layer 50 are exposed through openings 56 and 58, as also shown in FIG. 6C.

Figure 7B:
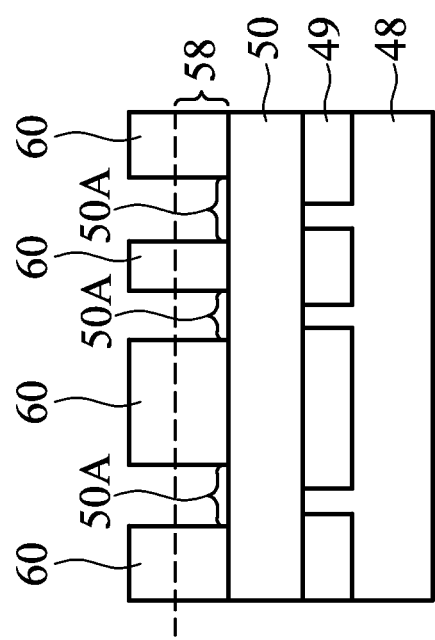
Figure 7C:
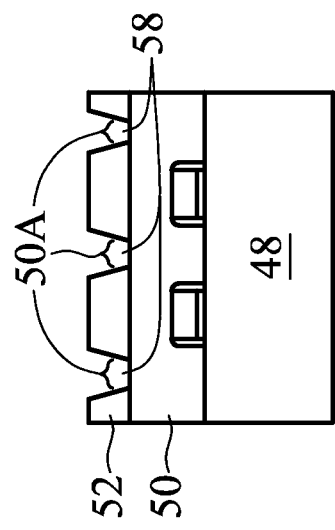

Referring to FIGS. 7A, 7B, and 7C, photo resist 54 is removed, and block layer 60 (including 60A and 60B) is formed over the resulting structure, and 6C, and is then patterned. FIGS. 7B and 7C are cross-sectional views obtained from the planes crossing lines B-B and C-C, respectively, in FIG. 7A. In accordance with some exemplary embodiments, block layer 60 comprises a photo resist, although it may also be formed of other materials that are different from the underlying materials of hard mask layer 52 and dielectric layer 50 (FIGS. 7B and 7C). In accordance with some embodiments, block layer 60 includes block layer portions 60A, which may be strips that have longitudinal directions perpendicular to the longitudinal directions of openings 58. In addition, block layer portions 60B, which are smaller than portions 60A, may be formed. Portions 60B are customized portions that are used to prevent the resulting contact plugs from bridging.

As shown in FIGS. 7A, 7B, and 7C, over dielectric layer 50 exist two mask layers. The first mask layer may be the patterned hard mask layer 52, and the second mask layer may be the patterned block layer 60 in accordance with exemplary embodiments. Each of the first and the second mask layers covers (blocks) some portions of dielectric layer 50, and leaves some other portions uncovered. The first and the second mask layers in combination leave portions 50A (FIGS. 7A, 7B, and 7C) of dielectric layer 50 not covered. The remaining portions of dielectric layer 50 are covered.

Figure 8A:
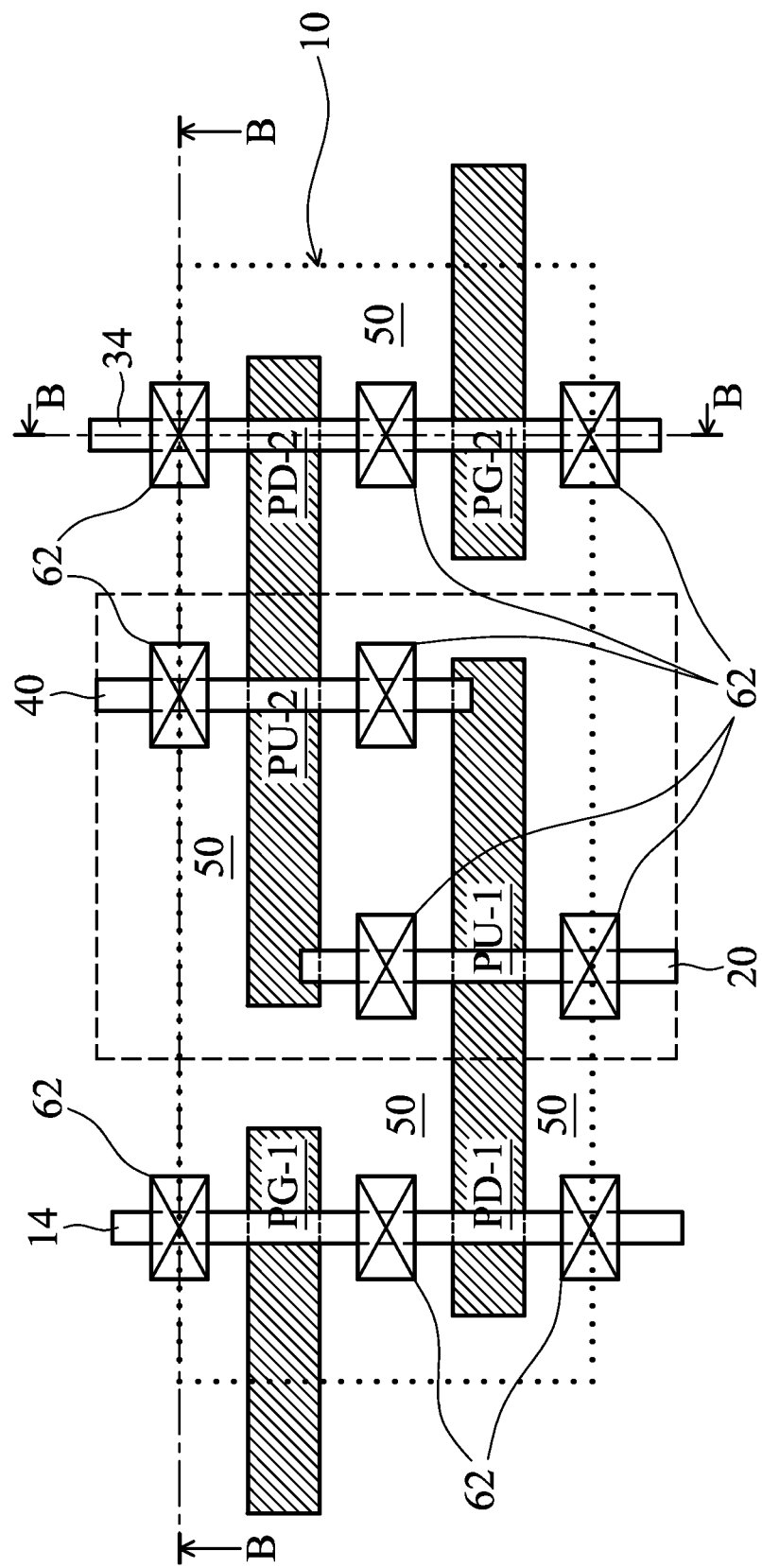
Figure 8B:
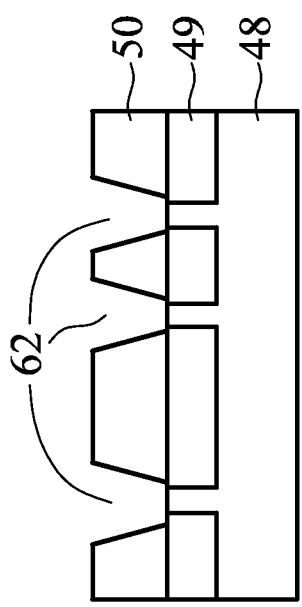
Figure 8C:
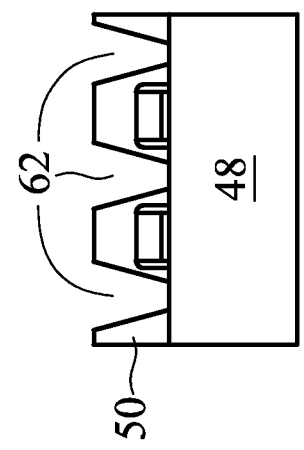

The first and the second mask layers 52 and 60 in FIGS. 7A, 7B, and 7C in combination are used as an etching mask to etch the exposed portions 50A of dielectric layer 50. After the etching step, block layer 60 and hard mask layer 52 are removed. FIGS. 8A, 8B, and 8C illustrate the resulting structure. FIGS. 8B and 8C are cross-sectional views obtained from the planes crossing lines B-B and C-C, respectively, in FIG. 8A. Contact openings 62 are formed in dielectric layer 50 as a result of the etching. As shown in FIG. 8A, the source/drain portions of fins 14, 20, 34, and 40 are exposed through contact openings 62.

Figure 9A:
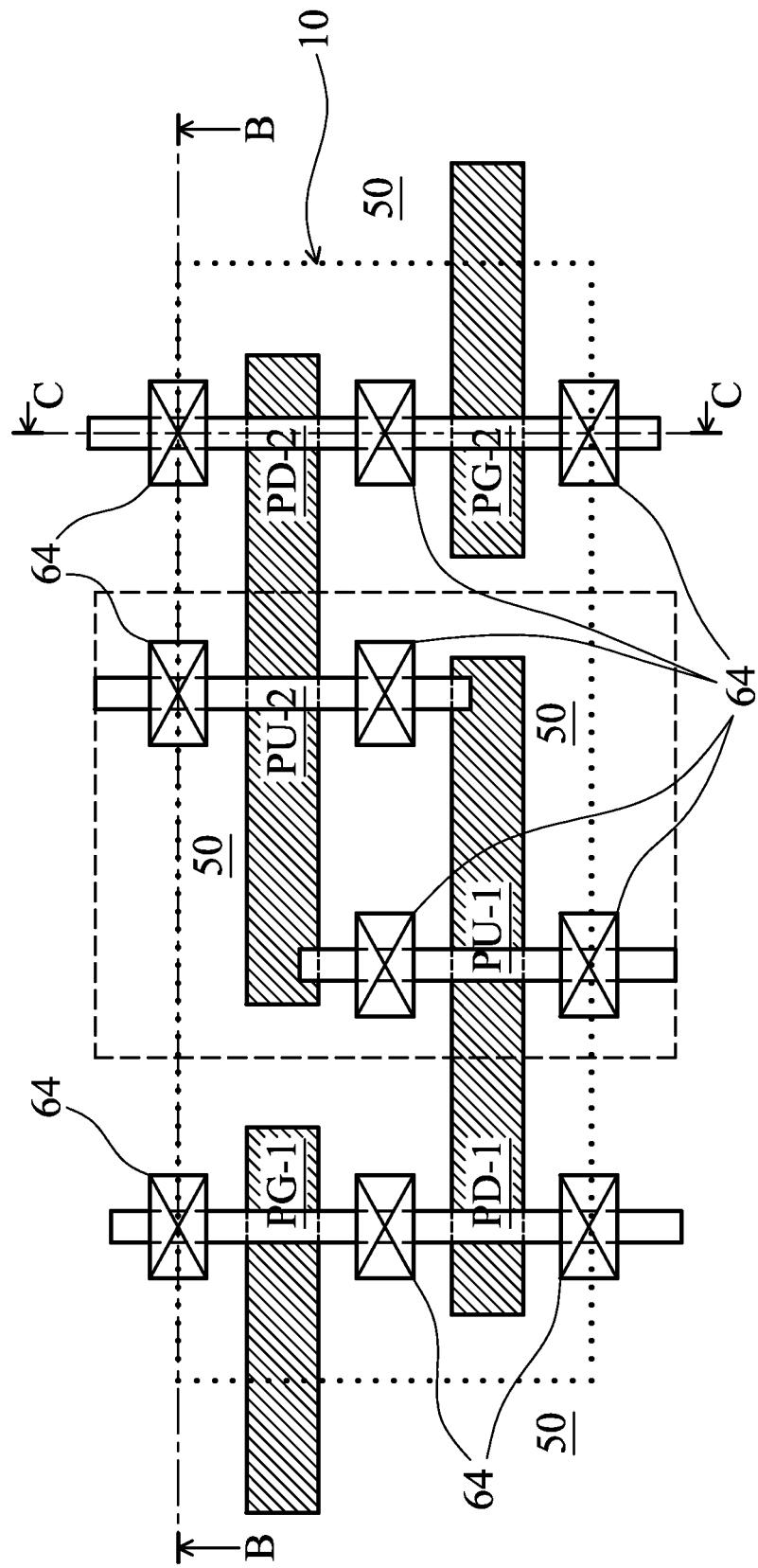
Figure 9B:
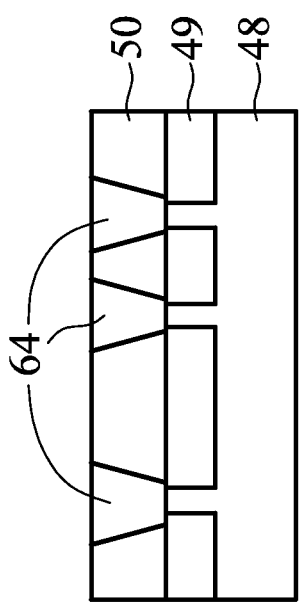
Figure 9C:
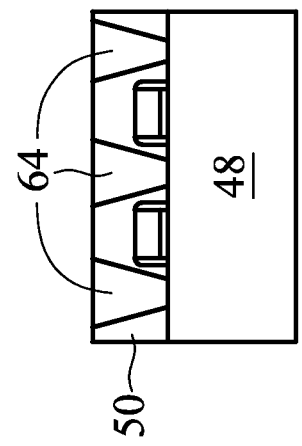

Referring to FIGS. 9A, 9B, and 9C, contact openings 62 in FIGS. 8A-8C are filled with a conductor material to form contact plugs 64, which are connected to the source and drain regions of transistors PU-1, PU-2, PD-1, PD-2, PG-1, and PG-2. FIGS. 9B and 9C are cross-sectional views obtained from the planes crossing lines B-B and C-C, respectively, in FIG. 9A. Contact plugs 64 may comprise copper, titanium, tantalum, tungsten, aluminum, or alloys thereof. Contact plugs 64 may correspond to the OD level contact plugs in FIG. 2.

Figure 10:
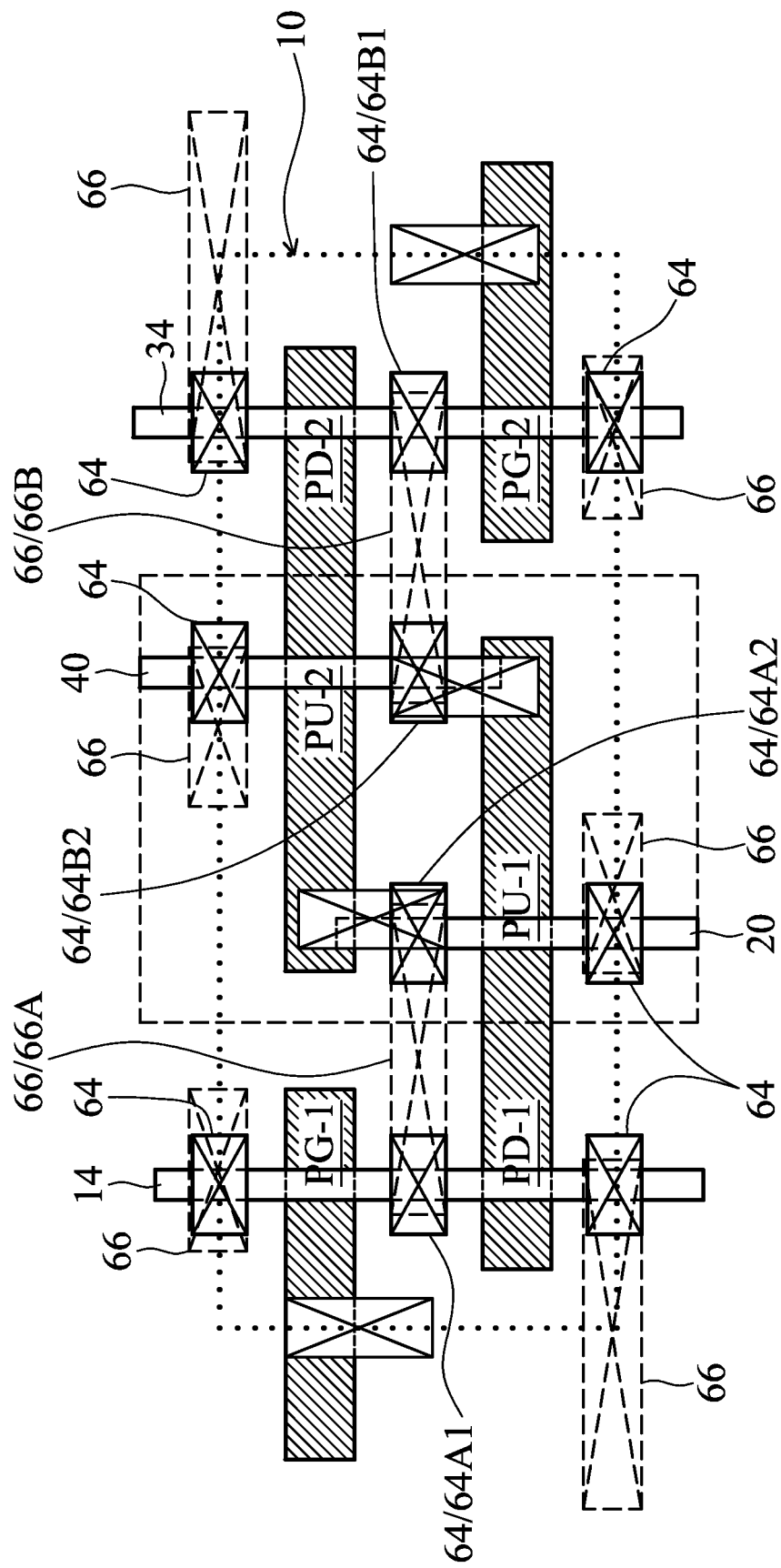

Contact plugs 64 are discrete contact plugs. Referring to FIG. 10, contact plugs 64 include contact plugs 64A1, 64A2, 64B1, and 64B2, which are over and connected to the drain regions of transistors PD1, PU1, PU-2, and PD-2, Additional metal connections 66 (including 66A and 66B) such as contact plugs, metal lines, vias, or combinations thereof, may be formed overlying contact plugs 64, and further interconnect contact plugs 64. For example, metal connection 66A is over and interconnecting contact plugs 64A1 and 64A2. Metal connection 66B is over and interconnecting contact plugs 64B 1 and 64B2.

Figure 11:
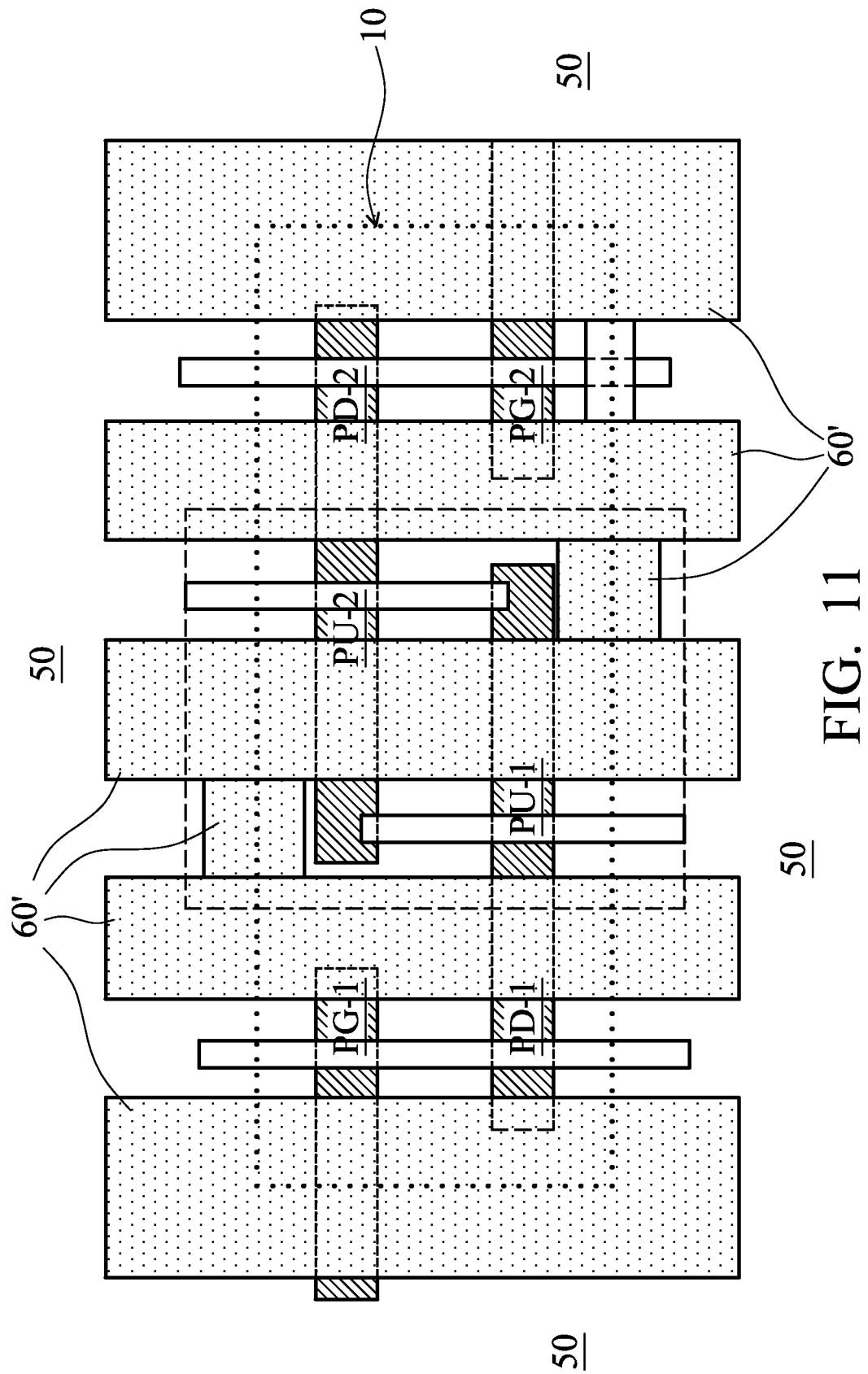
FIGS. 11 and 12 are top views of intermediate stages in the formation of an SRAM cell in accordance with alternative embodiments.
Figure 12:
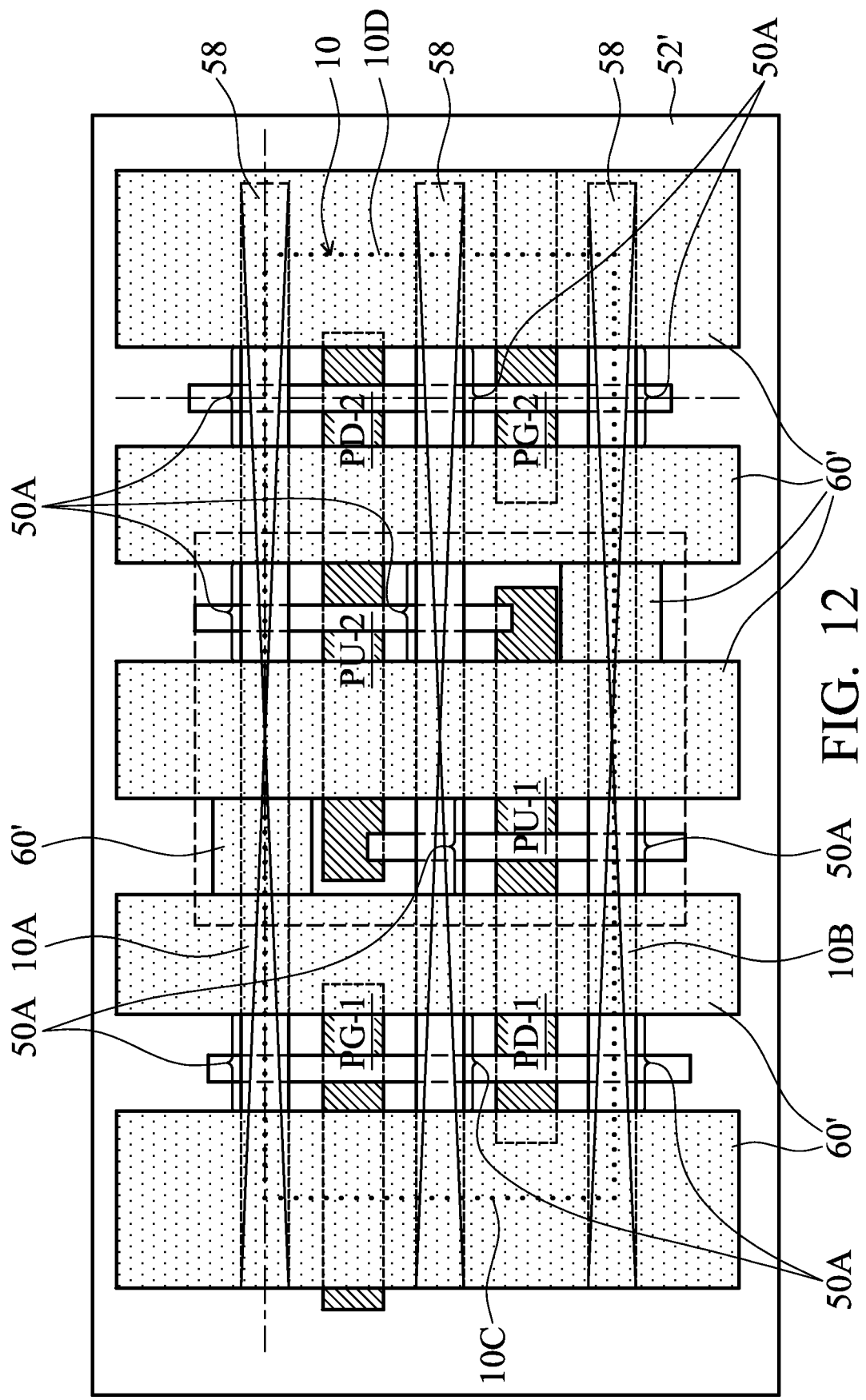

FIGS. 11 and 12 illustrate top views of intermediate stages in the formation of SRAM cell 10 in accordance with alternative embodiments. Unless specified otherwise, the materials and formation methods of the components in these embodiments (and in embodiments in FIGS. 13 through 17) are essentially the same as the like components, which are denoted by like reference numerals in the embodiments shown in FIGS. 1 through 10. The details regarding the formation process and the materials of the components shown in FIGS. 11 and 12 may thus be found in the discussion of the embodiments shown in FIGS. 1 through 10.

Referring to FIG. 11, transistors PU-1, PU-2, PD-1, PD-2, PG-1, and PG-2 are formed, and over which dielectric layer(s) 50 is formed, wherein the cross-sectional view of dielectric layer 50 is essentially the same as in FIGS. 3B and 3C. Next, block layer 60' is formed over dielectric layer 50 and patterned. Block layer 60' may be formed using a material selected from the same group of candidate materials as hard mask layer 52 in FIGS. 3A-3C. Block layer 60' may have a layout same as, and covers the same portions of SRAM cell 10 as, block layer 60 in FIG. 7A.

Next, as shown in FIG. 12, mask layer 52' is formed over the structure in FIG. 11. Mask layer 52' is patterned to form openings 56, which have the shapes, the sizes, and the locations similar to openings 56 in FIG. 4, except openings 56 are now in mask layer 52'. For example, openings 56 may have the length equal to, and may overlap, the long boundaries 10A and 10B of SRAM cell 10. Mask layer 52' may be formed using a material selected from the same group of candidate materials as layer 60 in FIGS. 7A-7C. Block layer 60' and mask layer 52' in combination cover (block) some portions of dielectric layer 50, and leaving portions 50A of dielectric layer 50 uncovered.

Next, block layer 60' and mask layer 52' in combination are used as an etching mask to etch the underlying dielectric layer 50 (also see FIGS. 8A-8C) to form contact openings 62. Block layer 60' and mask layer 52' are then removed. The resulting structure is the same as the structures in FIGS. 8A through 8C. In subsequent steps, the process in FIGS. 9A, 9B, 9C, and 10 are performed to finish the formation of SRAM cell 10.

Figure 13:
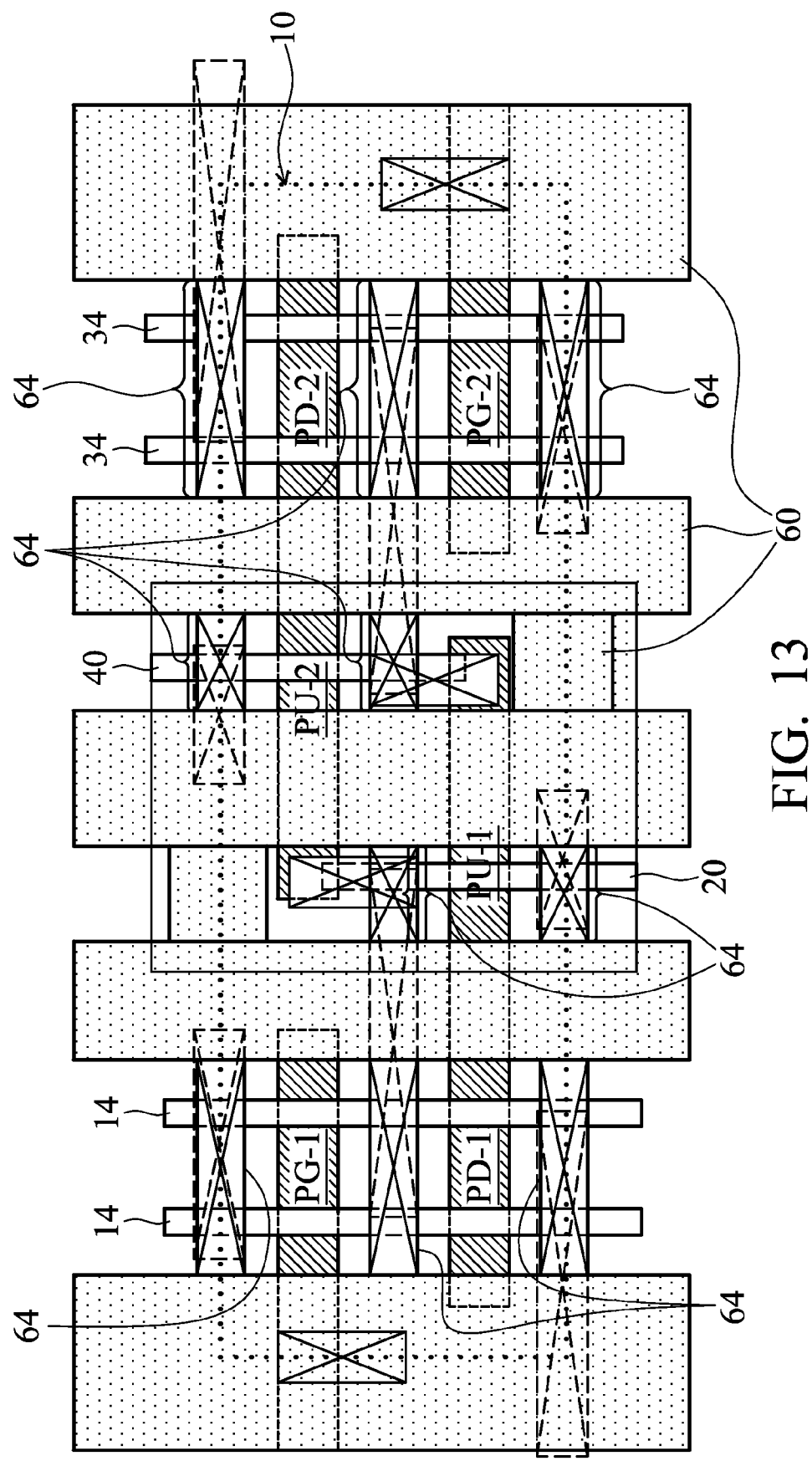
FIG. 13 illustrates an SRAM cell in accordance with exemplary embodiments, wherein some transistors in the SRAM cell are multi-fin FinFETs.

FIG. 13 illustrates a top view of SRAM cell 10 in accordance with alternative embodiments. These embodiments are similar to the embodiments in FIG. 10, except that transistors PG-1, PD-1, PG-2, and PD-2 are multi-fin transistors, as compared to single-fin transistors PG-1, PD-1, PG-2, and PD-2 in FIG. 10. Although it is illustrated that each of transistors PG-1, PD-1, PG-2, and PD-2 comprises two fins, they may comprise more than two fins, such as three fins, four fins, or more. The formation processes may be the same as in FIGS. 3 through 12, and hence are not discussed herein. In FIG. 13, mask layer patterns 60 are illustrated to show their positions with relative to the positions of transistors, although at the time contact plugs 64 are formed, mask layer patterns 60 have already been removed.

Figure 14:
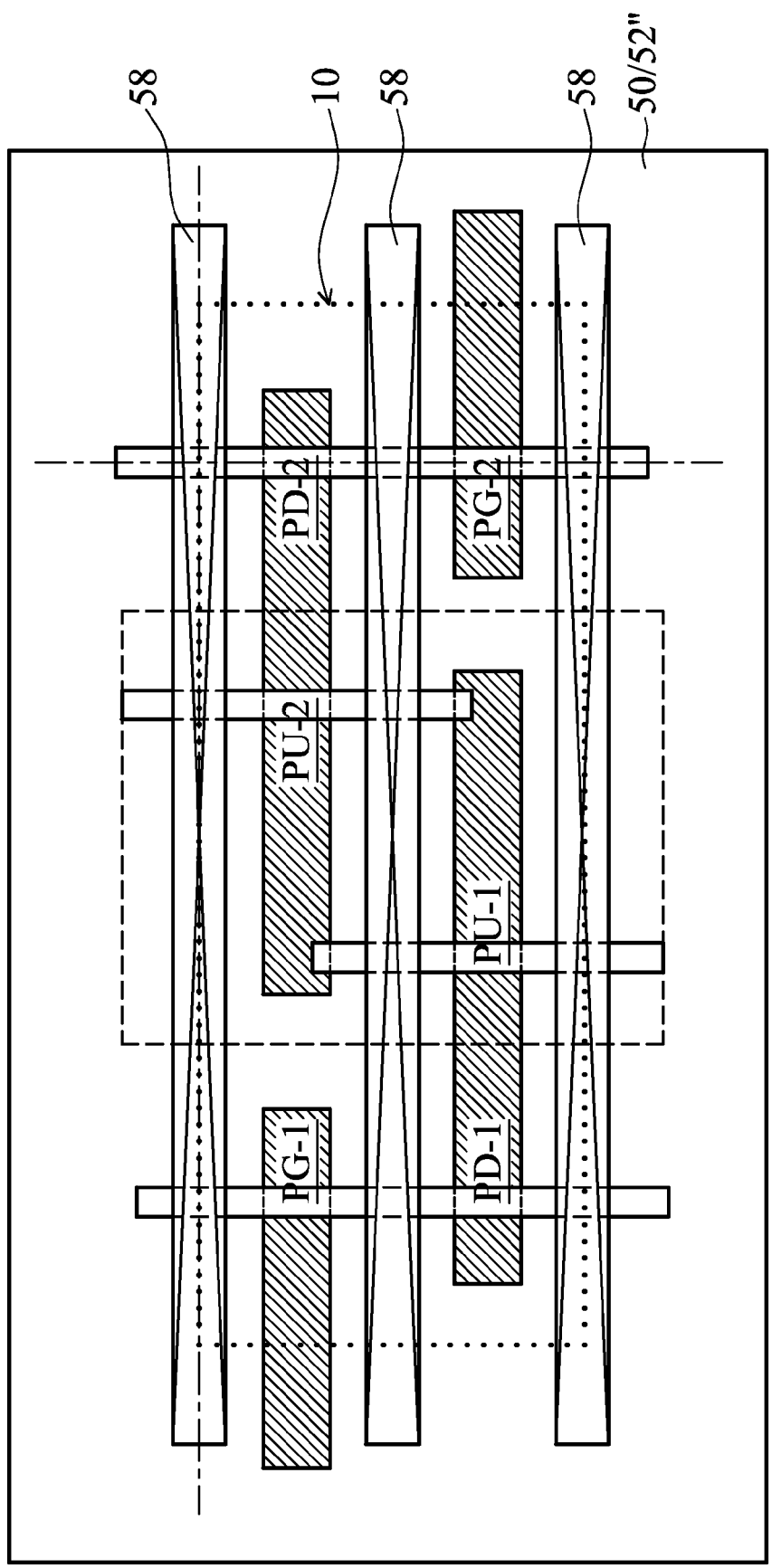
FIGS. 14-16 are top views of intermediate stages in the formation of an SRAM cell in accordance with yet alternative embodiments.
Figure 15:
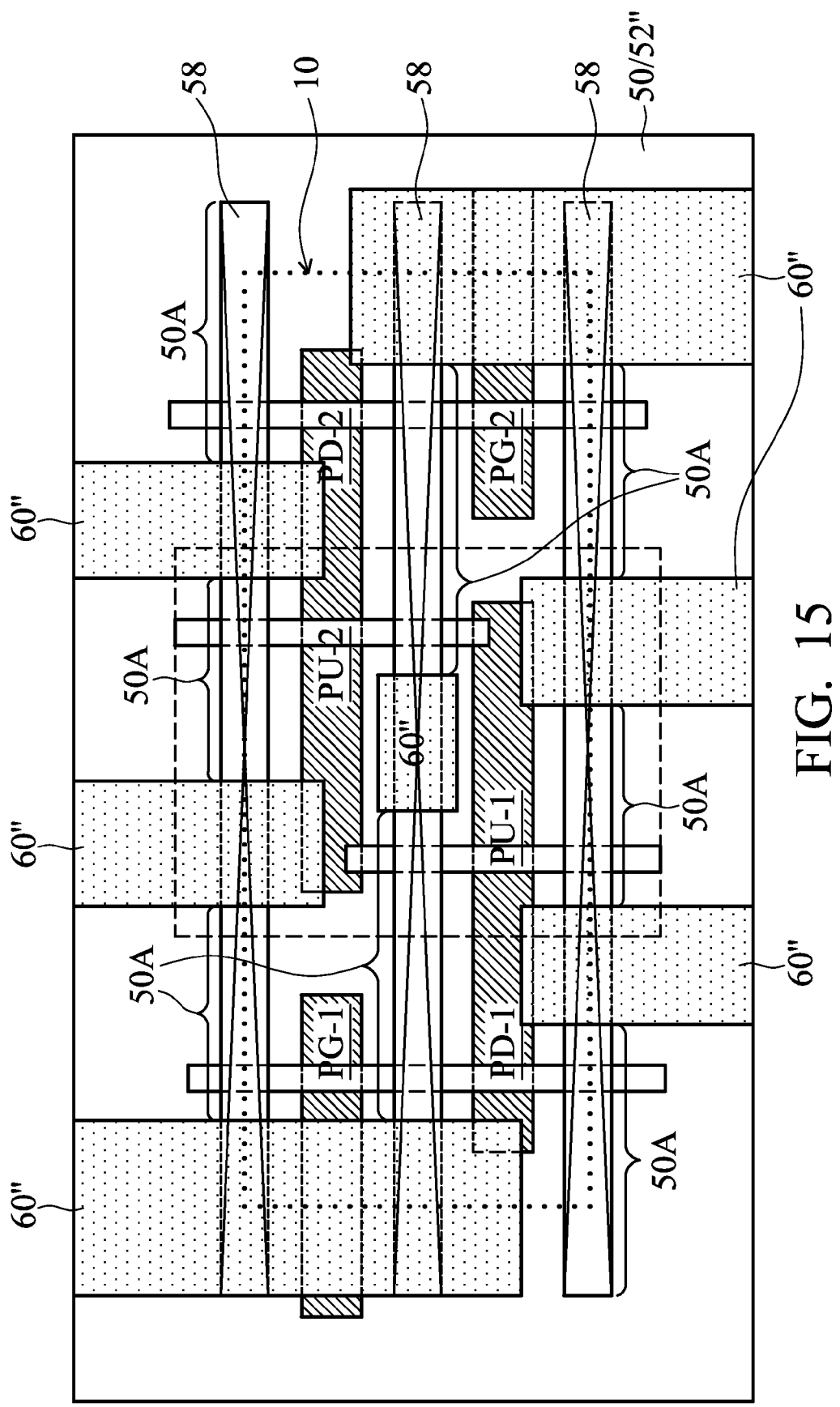
Figure 16:
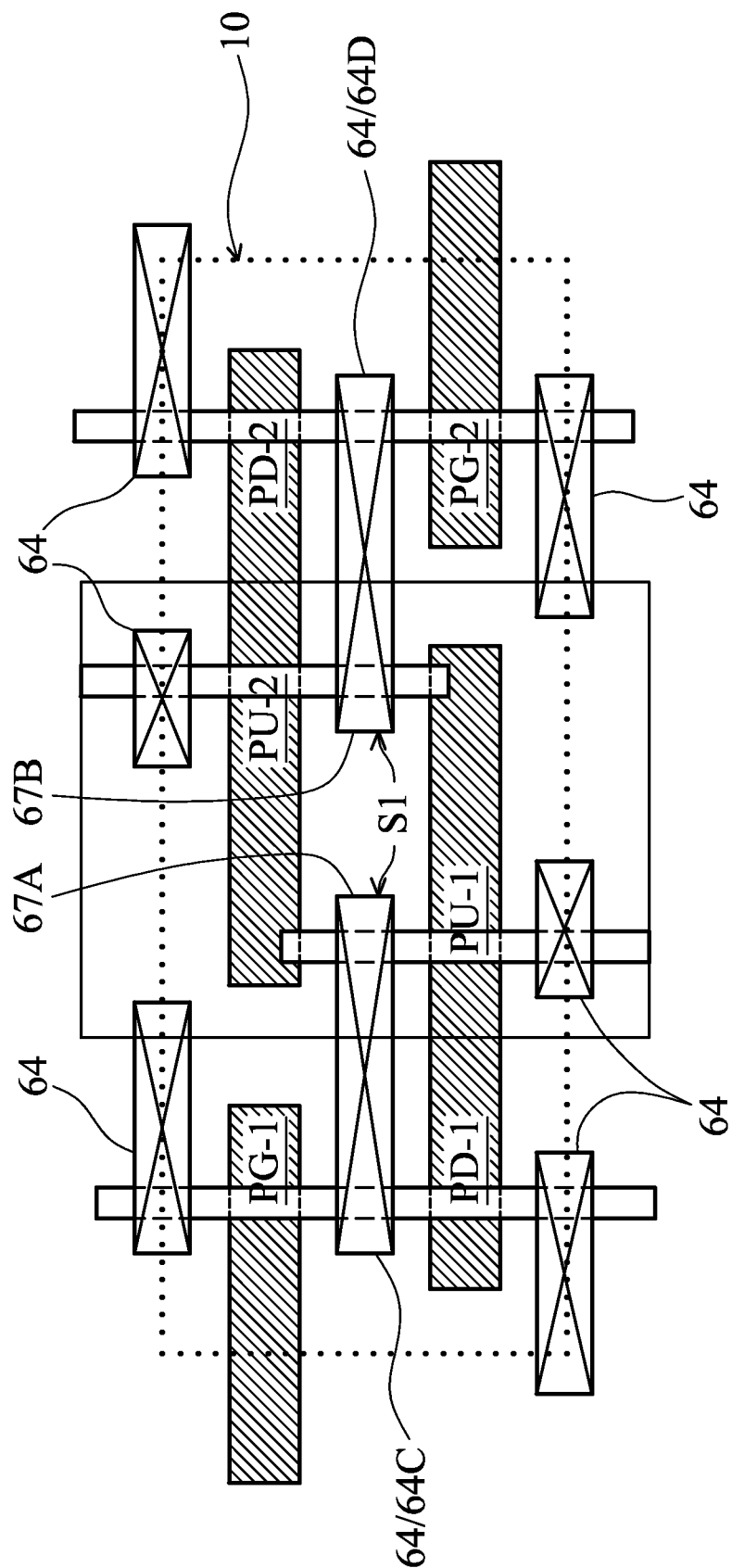

FIGS. 14 through 16 illustrate top views of intermediate stages in the formation of SRAM cell 10 in accordance with alternative embodiments. Referring to FIG. 14, transistors PU-1, PU-2, PD-1, PD-2, PG-1, and PG-2 are formed, and dielectric layer(s) 50 and mask layer 50" are formed, wherein the cross-sectional view of the structure in FIG. 14 is essentially the same as in FIGS. 3B and 3C. Next, as in FIG. 15, mask layer 60" is formed over dielectric layer 50 and mask layer 50" and patterned. In accordance with some embodiments, as shown in FIGS. 14 and 16, mask layer 52", which includes openings 58 therein, is formed first, followed by the formation of mask layer 60" over mask layer 52". The respective process may be essentially the same as in FIGS. 3A through 10, with the formation of mask layer 52" corresponding to hard mask layer 52, and the formation of mask layer 60" corresponding to the formation of block layer 60. In alternative embodiments, mask layer 60" is formed first, followed by the formation of mask layer 52" over mask layer 52". The respective process may be essentially the same as in FIGS. 11, 12, and 9A-10, with the formation of mask layer 60" corresponding to the formation of block layer 60', and the formation of mask layer 52" corresponding to the formation of mask layer 52'. It is observed that in FIG. 15, mask layer 60" form islands (rather than long strips), and have patterns different from the patterns of mask layer 60 (FIG. 7A) and 60' (FIG. 12). As a result, portions 50A, which are portions of dielectric layer 50 not covered by mask layers 52" and 60", are etched to form openings in dielectric layer 50.

In subsequent steps, the openings generated due to the etching of dielectric layer 50 are filled to form contact plugs 64, which are shown in FIG. 16. Contact plugs 64 include 64C and 64D, which are long contacts. Contact plug 64C interconnects the drain regions of transistors PD-1 and PU-1 to form a part of data node 110 (also refer to FIG. 1). Contact plug 64D interconnects the drain regions of transistors PD-2 and PU-2 to form a part of data node 112 (also refer to FIG. 1). Alternatively stating, contact plug 64C performs the same function as contact plugs 64A1, 64A2, and metal connection 66A in FIG. 10, and contact plug 64D performs the same function as contact plugs 64B 1, 64B2, and metal connection 66B in FIG. 10. Accordingly, although mask layer 60" has a more complicated layout than mask layers 60 in FIG. 7A and mask layer 60' in FIG. 11, the formation of metal connections 66A and 66B in FIG. 10 may be skipped when the embodiments in FIGS. 14-16 are adopted.

Figure 17:
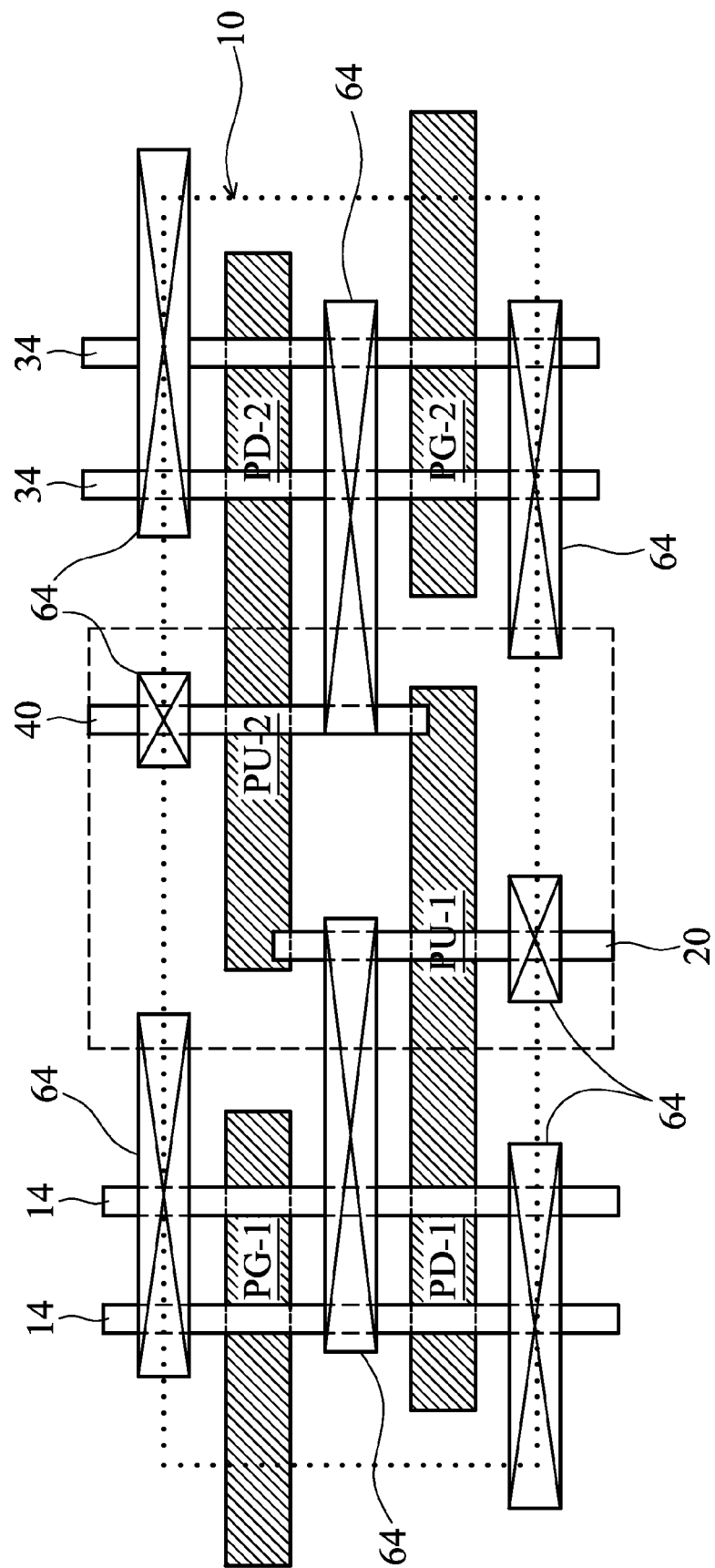
FIG. 17 is a top view of an SRAM cell comprising multi-fin FinFETs.

FIG. 17 illustrates a top view of SRAM cell 10 in accordance with alternative embodiments. These embodiments are similar to the embodiments in FIG. 16, except that transistors PG-1, PD-1, PG-2, and PD-2 are multi-fin transistors, as compared to single-fin transistors PG-1, PD-1, PG-2, and PD-2 in FIG. 16. Although it is illustrated that transistors PG-1, PD-1, PG-2, and PD-2 comprise two fins, they may comprise more than two fins, such as three fins, four fins, or more. The formation processes may be the same as in FIGS. 14 through 16, and hence are not discussed herein.

Figure 18A:
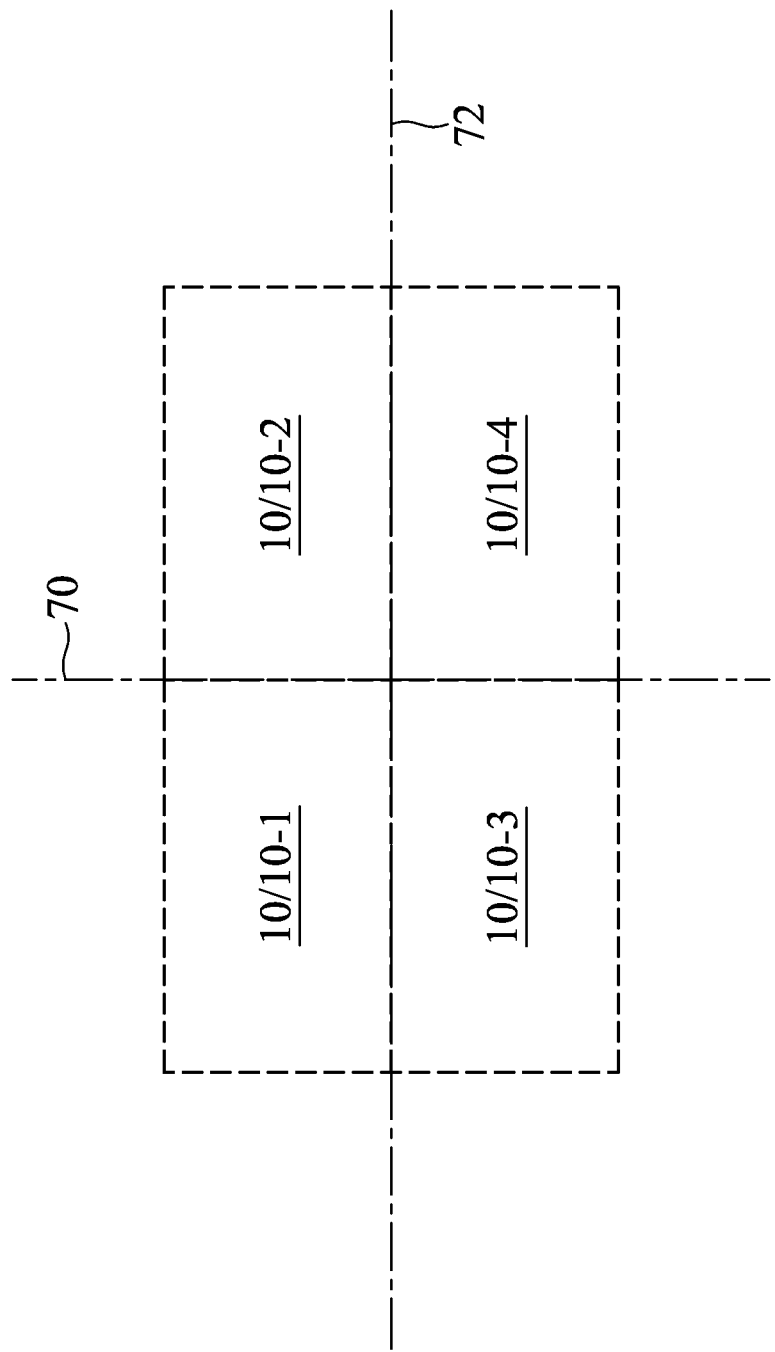
FIG. 18 illustrates the repetition of the SRAM cells.
Figure 18B:
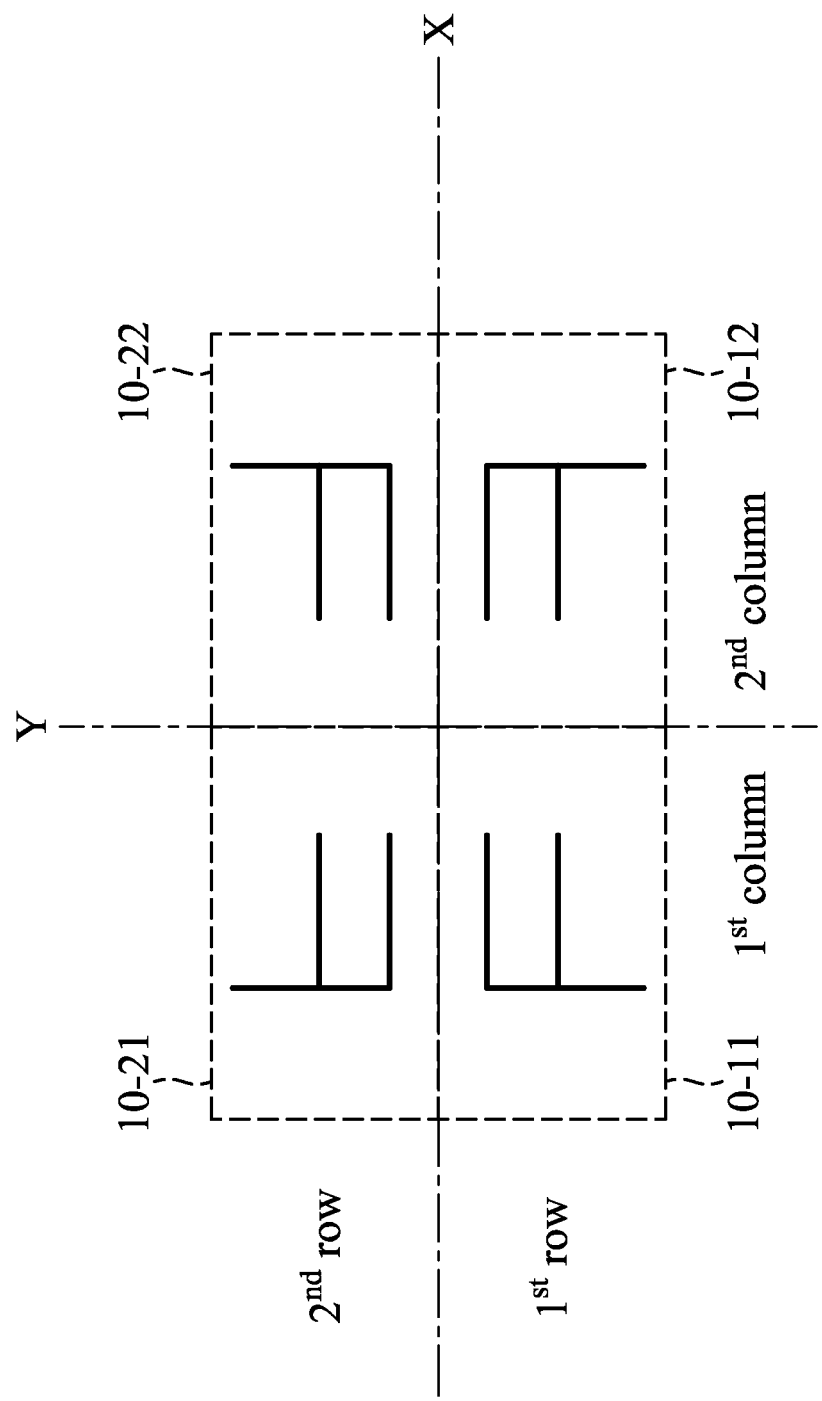

In above-discussed embodiments, a single SRAM cell is illustrated and discussed to explain the embodiments. It is appreciated that an SRAM array may comprise a plurality of SRAM cells. To form an SRAM array, a scheme as in FIG. 18 may be used. SRAM cells 10-11, 10-12, 10-21, and 10-22 in FIG. 18 have an identical structure, and may have any of the structures in FIGS. 10, 13, 16, 17, or the like. SRAM cells 10-11, 10-12, 10-21, and 10-22 are disposed in a first row, a second row, a first column, and a second column. A symbol "F" is illustrated in each of SRAM cells 10-11, 10-12, 10-21, and 10-22 to indicate the orientation of the SRAM cells. It is appreciated that symbol "F" is merely used to show the directions of SRAM cells, and are not parts of the respective SRAM cells. SRAM cell 10-11 and SRAM cell 10-12 are symmetric with relative to the illustrated Y axis. SRAM cell 10-21 and SRAM cell 10-22 are symmetric with relative to the illustrated Y axis. SRAM cell 10-11 and SRAM cell 10-21 are symmetric with relative to the illustrated X axis. SRAM cell 10-12 and SRAM cell 10-22 are symmetric with relative to the illustrated X axis. SRAM cells 10-11, 10-12, 10-21, and 10-22 as a group may be reproduced and allocated as a plurality of rows and columns to form the SRAM array.

Figure 19:
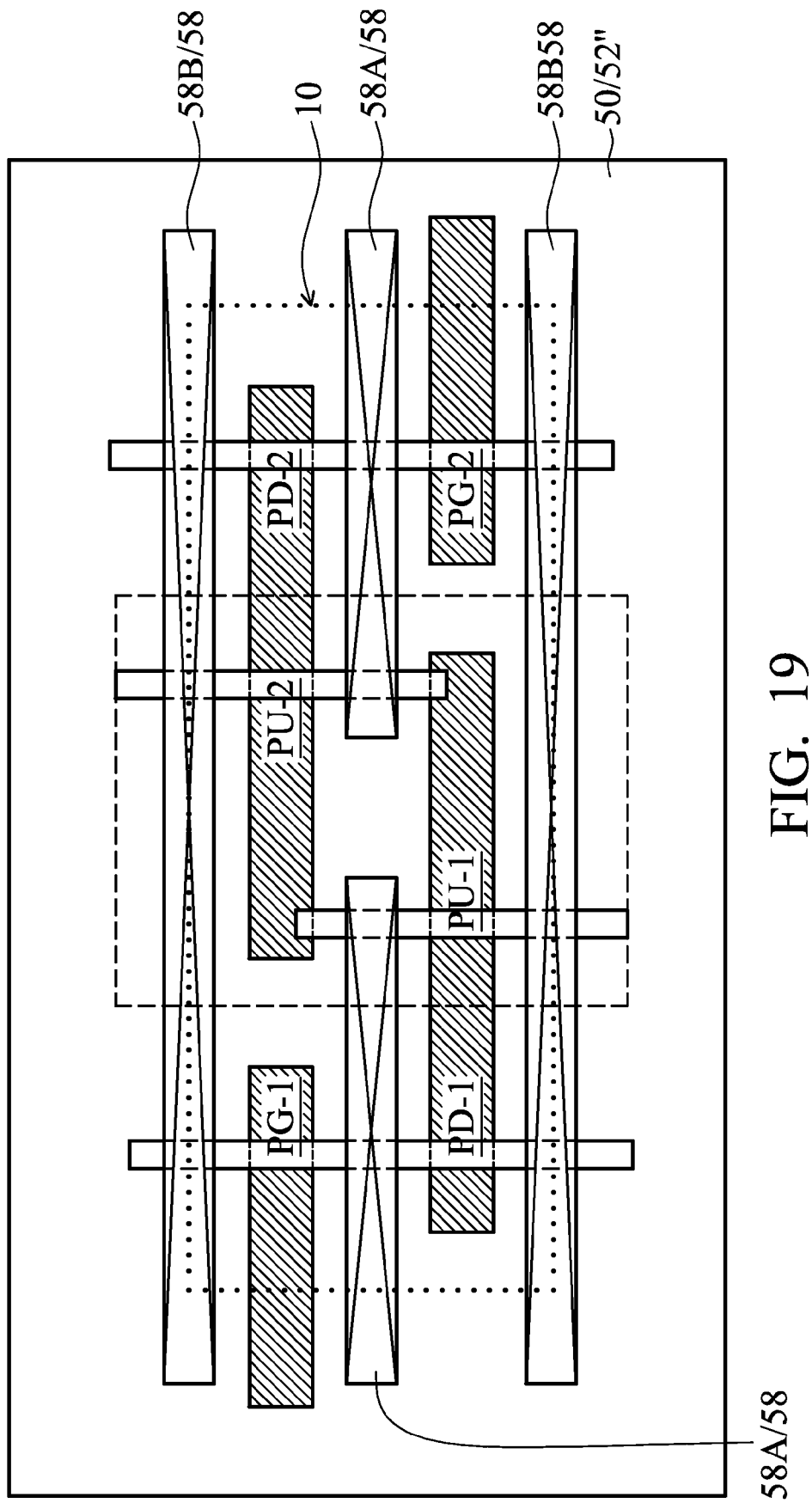
FIGS. 19-24 are top views of intermediate stages in the formation of an SRAM cell in accordance with yet alternative embodiments.
Figure 20:
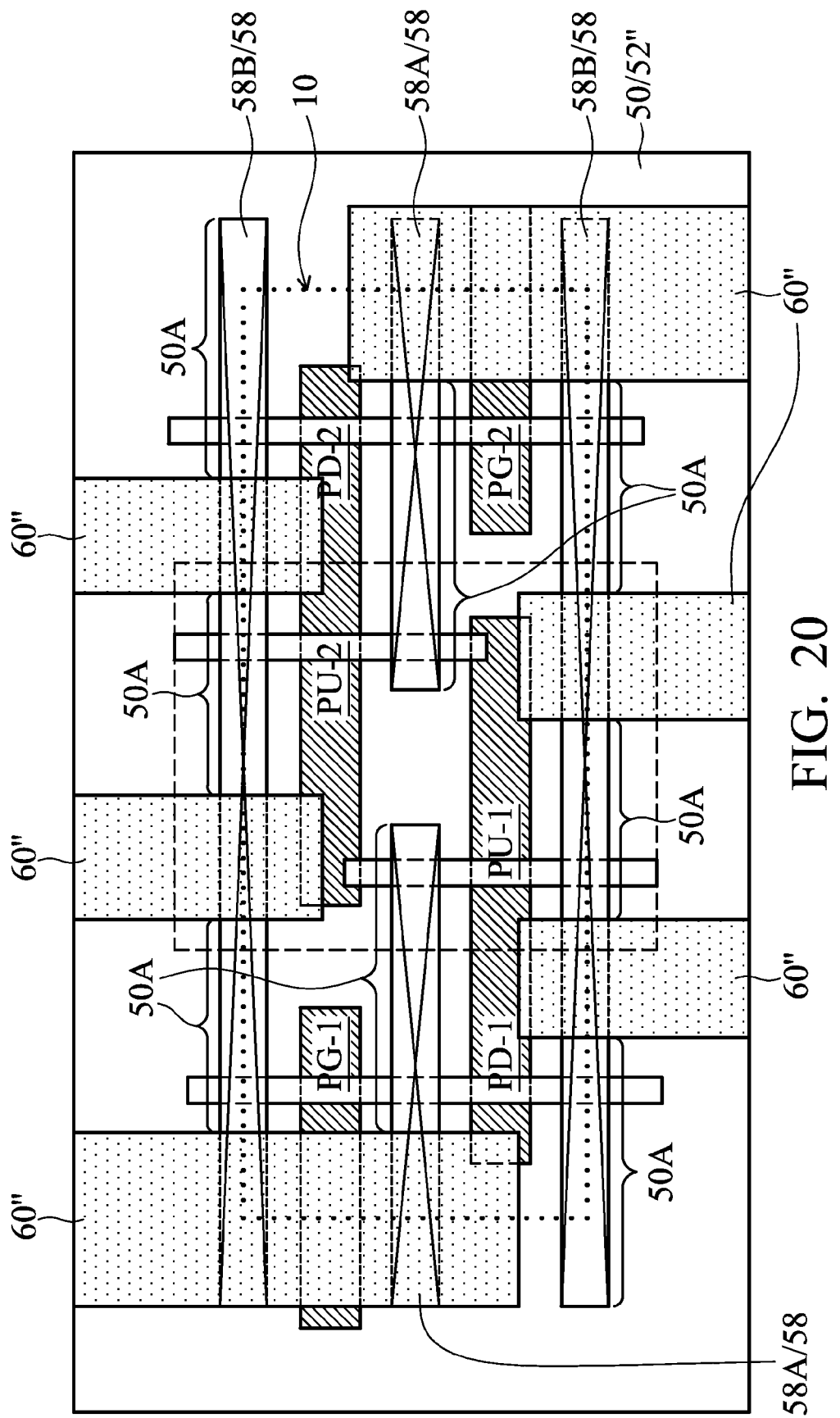
Figure 21:
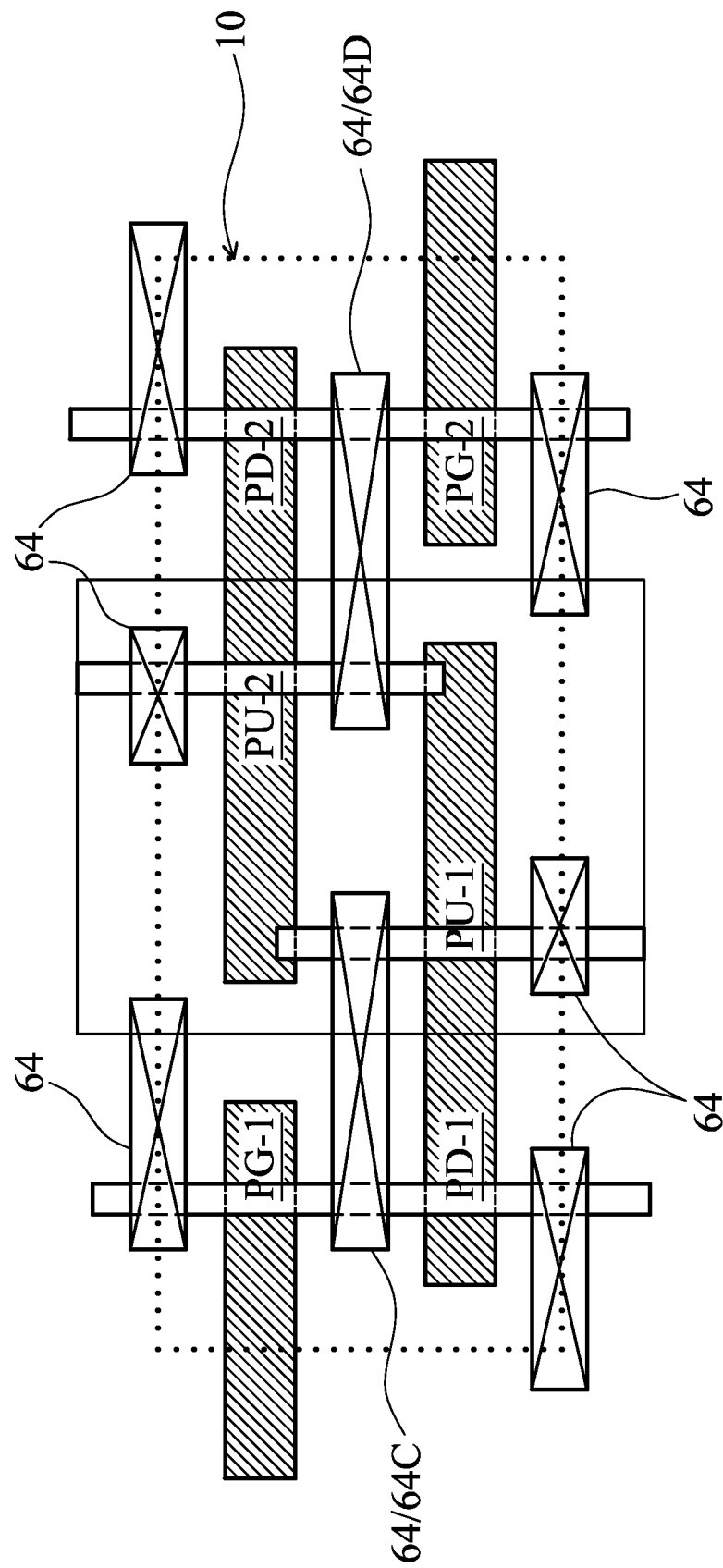

FIGS. 19 through 21 illustrate top views of intermediate stages in the formation of SRAM cell 10 in accordance with alternative embodiments. These embodiments are similar to the embodiments in FIGS. 14-16, except that openings 58 include openings 58A that do not extend from one boundary of SRAM cell 10 all the way to the opposite boundary. Openings 58 also include openings 58B that extend from one boundary of SRAM cell 10 to the opposite boundary. In these embodiments, openings 58A are separate from each other, and may be aligned to a straight line. Openings 58A also extend to the short boundaries of SRAM cell 10, and hence are connected to the openings 58A (not shown) in neighboring SRAM cells (not shown, please refer to FIG. 18). A brief process is discussed below.

Referring to FIG. 19, transistors PU-1, PU-2, PD-1, PD-2, PG-1, and PG-2 are formed, and dielectric layer(s) 50 and mask layer 52" are formed, wherein the cross-sectional view of the structure in FIG. 19 is essentially the same as in FIGS. 3B and 3C. Next, as in FIG. 20, mask layer 60" is formed over dielectric layer 50 and mask layer 52" and patterned. In accordance with some embodiments, as shown in FIGS. 19 and 20, mask layer 52", which includes openings 58 therein, is formed first, followed by the formation of mask layer 60" over mask layer 52". The respective process may be essentially the same as in FIGS. 3A through 10, with the formation of mask layer 52" corresponding to hard mask layer 52, and the formation of mask layer 60" corresponding to the formation of block layer 60. In alternative embodiments, mask layer 60" is formed first, followed by the formation of mask layer 52" over mask layer 60". The respective process may be essentially the same as in FIGS. 11, 12, and 9A-10, with the formation of mask layer 60" corresponding to the formation of block layer 60', and the formation of mask layer 52" corresponding to the formation of mask layer 52'. Mask layer 52" and mask layer 60" in combination leave portions 50A of dielectric layer 50 not covered. It is observed that in FIG. 20, there is no small mask pattern 60" in the middle of SRAM cell 10, as compared to FIG. 15. Since the small mask pattern 60" (FIG. 15) in the middle of SRAM cell 10 is difficult to form in some embodiments, forming disconnected openings 58A initially reduces process difficulty.

In subsequent steps, dielectric layer 50 is etched to form openings, which are then filled to form contact plugs 64, as shown in FIG. 21. As also shown in both FIGS. 20 and 21, openings 58A in combination with mask layer 60" result in shortened contact plugs 64C and 64D. Furthermore, openings 58B in combination with mask layer 60" also result in shortened contact plugs. Contact plug 64C interconnects the drain regions of transistors PD-1 and PU-1 to form a part of data node 110 (refer to FIG. 1). Contact plug 64D interconnects the drain regions of transistors PD-2 and PU-2 to form a part of data node 112 (refer to FIG. 1). Alternatively stating, contact plug 64C performs the same function as contact plugs 64A1, 64A2, and metal connection 66A in FIG. 10, and contact plug 64D performs the same function as contact plugs 64B1, 64B2, and metal connection 66B in FIG. 10. Accordingly, although mask layer 60" has a more complicated layout than mask layers 60 in FIG. 7A, the formation of metal connections 66A and 66B in FIG. 10 may be skipped when the embodiments in FIGS. 19-21 are adopted.

Figure 22:
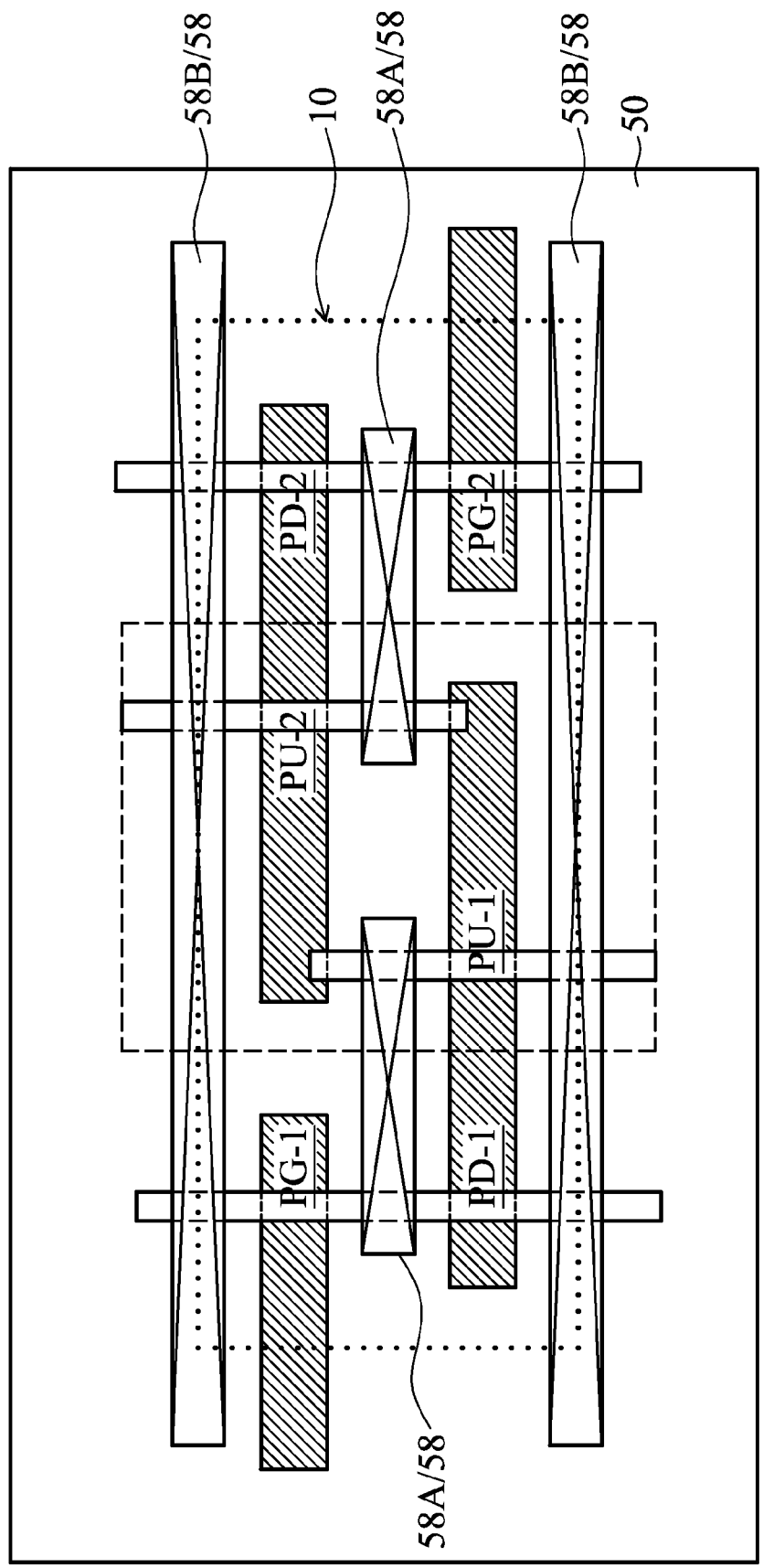
Figure 23:
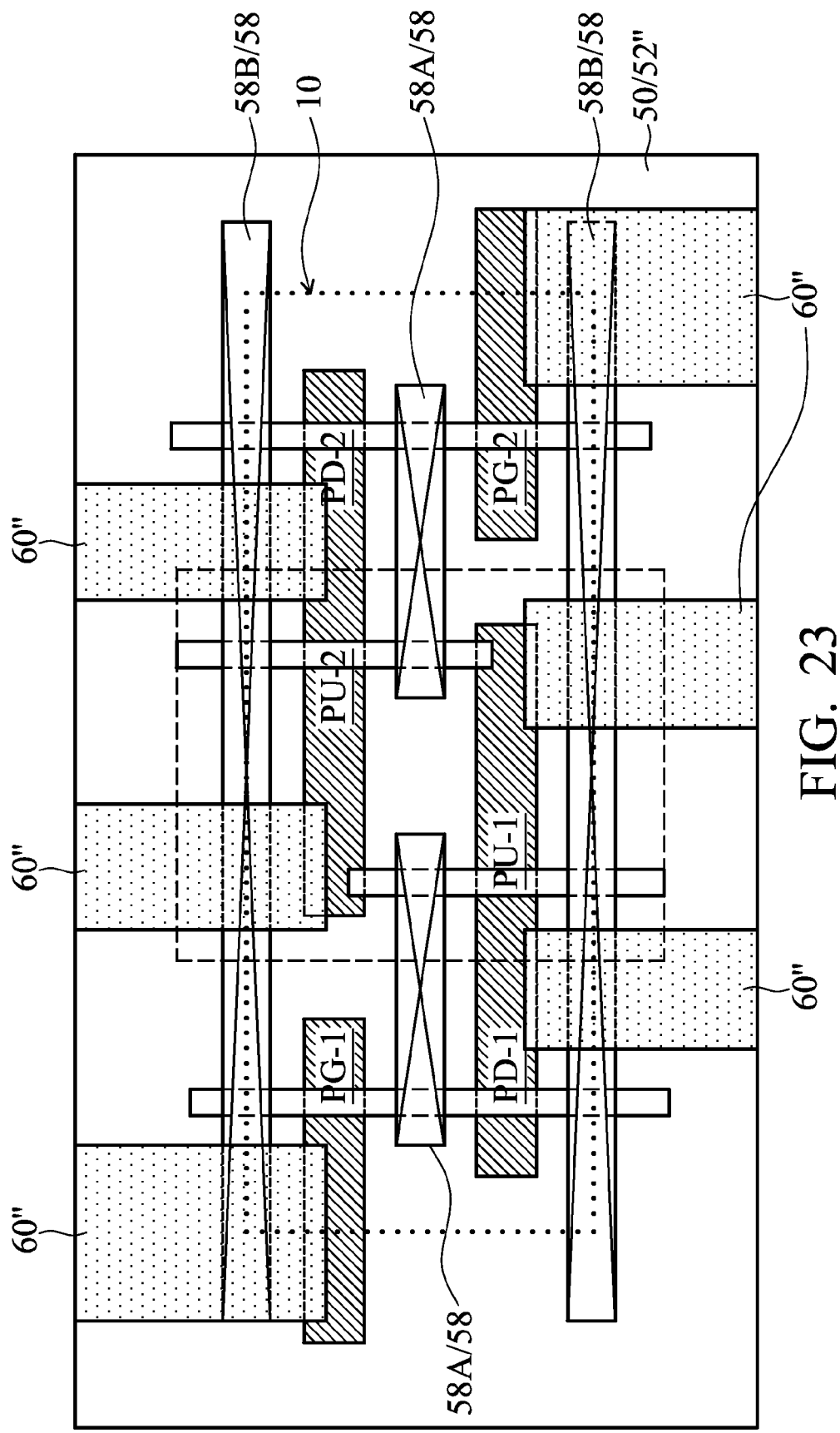
Figure 24:
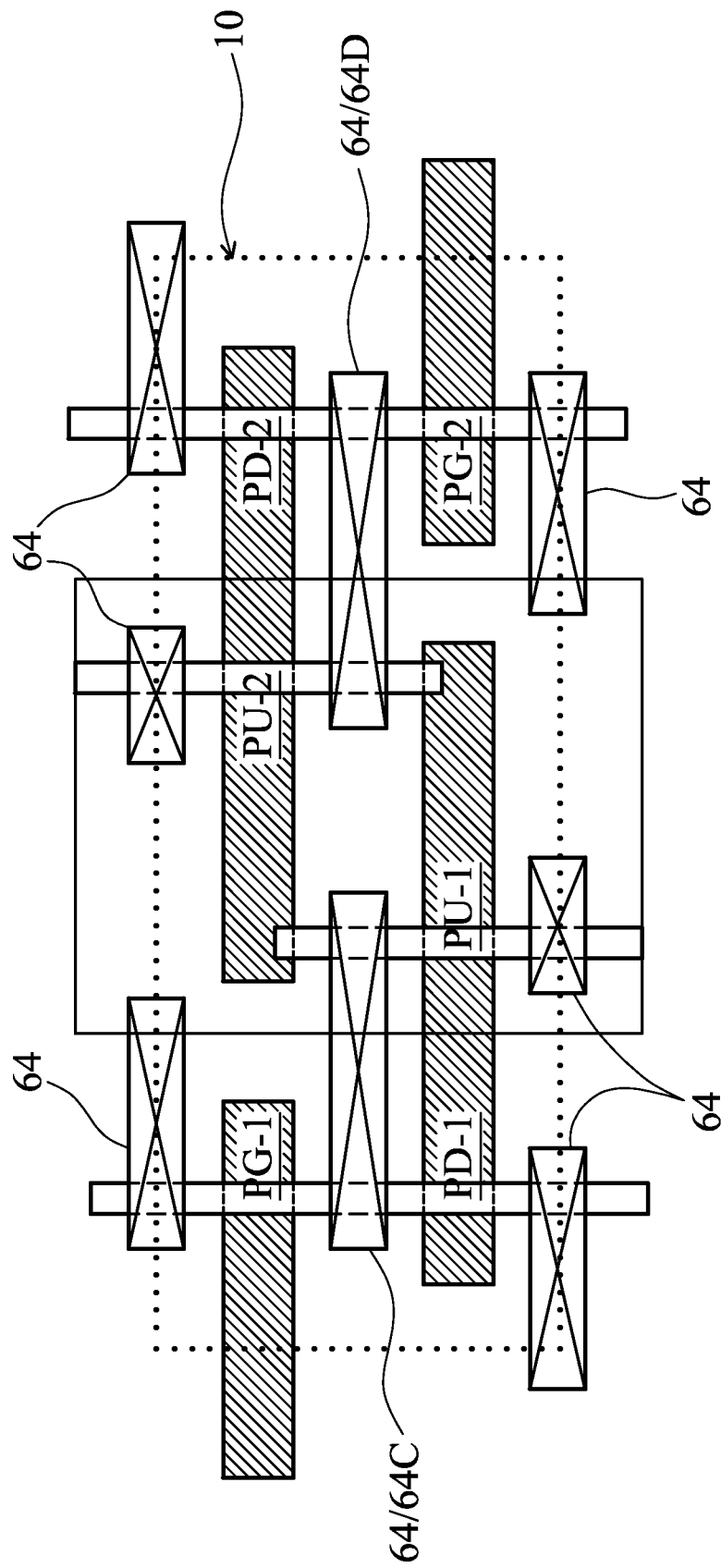

FIGS. 22 through 24 illustrate top views of intermediate stages in the formation of SRAM cell 10 in accordance with alternative embodiments. These embodiments are essentially the same as the embodiments in FIGS. 19-21, except that openings 58 include openings 58A that do not extend to any boundary of SRAM cell 10. Openings 58A are separate from each other, and may be aligned to a straight line. Openings 58A also do not extend to any of the boundaries of SRAM cell 10, and hence are disconnected from the openings 58A (not shown) in neighboring SRAM cells (not shown, please refer to FIG. 18). A brief process is discussed below.

Referring to FIG. 22, transistors PU-1, PU-2, PD-1, PD-2, PG-1, and PG-2 are formed, and dielectric layer(s) 50 and mask layer 52" are formed, with openings 58 (including 58A and 58B) formed in mask layer 52". The cross-sectional view of the structure in FIG. 22 is essentially the same as in FIGS. 3B and 3C. Next, as in FIG. 23, mask layer 60" is formed over dielectric layer 50 and patterned. In accordance with some embodiments, as shown in FIGS. 22 and 23, mask layer 52'', which includes openings 58 therein, is formed first, followed by the formation of mask layer 60'' over mask layer 52''. FIG. 23 illustrates the respective mask layer 60''. It is observed that since openings 58A are initially (as formed) spaced apart from the short boundaries of SRAM cell 10, mask layer 60'' do not need to cover openings 58A. In alternative embodiments, mask layer 60'' is formed first, followed by the formation of mask layer 52'' over mask layer 60''. The respective process may be essentially the same as in FIGS. 11, 12, and 9A-10, with the formation of mask layer 60'' corresponding to the formation of block layer 60', and the formation of mask layer 52'' corresponding to the formation of mask layer 52'. The remaining process steps as in FIGS. 23 and 24 are essentially the same as in FIGS. 20 and 21, respectively, and are not repeated herein.

In the embodiments, by forming two mask layers, for example, one hard mask layer and one block layer, the limit set forth by the lithograph process is alleviated. For example, referring to FIG. 16, contact plugs 64C has line end 67A facing the line end 67B of contact plug 64D, wherein line ends 67A and 67B are close to each other with a very small spacing S1, which may be between about 20 nm and about 50 nm. If formed using conventional lithography methods, such small spacing S1 may cause line-end shortening or line-end-to-line-end bridging. The problem is further worsened when Fin-FETs are used to form SRAM cells due to the narrow active regions of FinFETs that require long contact. In accordance with the embodiments of the present disclosure, however, wide and/or long mask layer patterns, rather than conventional narrow and short patterns, are formed for the formation of contact plugs. The line-end shortening or line-end-to-line-end bridging problems are thus reduced.

In accordance with some embodiments, a method includes forming a dielectric layer over a portion of an SRAM cell. The SRAM cell includes a first pull-up transistor and a second pull-up transistor, a first pull-down transistor and a second pull-down transistor forming cross-latched inverters with the first pull-up transistor and the second pull-up transistor, and a first pass-gate transistor and a second pass-gate transistor connected to drains of the first pull-up transistor and the first pull-down transistor and drains of the second pull-up transistor and the second pull-down transistor, respectively. A first mask layer is formed over the dielectric layer and patterned. A second mask layer is formed over the dielectric layer and patterned. The dielectric layer is etched using the first mask layer and the second mask layer in combination as an etching mask, wherein a contact opening is formed in the dielectric layer. A contact plug is formed in the contact opening.

In accordance with other embodiments, a method includes forming an SRAM cell including a plurality of gate electrodes and a plurality of active region strips, wherein the plurality of active region strips form transistors with the plurality of gate electrodes. The method further includes forming an ILD over the plurality of gate electrodes and the plurality of active region strips, and forming a first mask layer over the ILD. The first hard mask layer covers first portions of the ILD, with second portions of the ILD exposed through openings in the first mask layer. A second mask layer is formed to have portions filled into parts of the openings in the first mask layer. The ILD is etched using the first mask layer and the second mask layer as an etching mask to form a plurality of contact openings in the ILD. A plurality of contact plugs is formed in the plurality of contact openings.

In accordance with yet other embodiments, an SRAM cell layout is embodied on a non-transitory computer-readable medium. The SRAM cell layout includes a first plurality of layout patterns of a plurality of gate electrodes, and a second plurality of layout patterns of a plurality of fin lines. The first and the second plurality of layout patterns are portions of cross-latched inverters including a first and a second pull-up transistor and a first and a second pull-down transistor, and two pass-gate transistors coupled to the cross-latched inverters. The SRAM cell layout further includes a third plurality of layout patterns of a first mask layer, and a fourth plurality of layout patterns of a second mask layer, wherein portions of the third plurality of layout patterns that are not overlapped by the fourth plurality of layout patterns comprise contact plug patterns of the SRAM cell.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a dielectric layer over a portion of a Static Random Access Memory (SRAM) cell, wherein the SRAM cell comprises:
        a first pull-up transistor and a second pull-up transistor;
        a first pull-down transistor and a second pull-down transistor forming cross-latched inverters with the first pull-up transistor and the second pull-up transistor; and
        a first pass-gate transistor and a second pass-gate transistor connected to drains of the first pull-up transistor and the first pull-down transistor and drains of the second pull-up transistor and the second pull-down transistor, respectively;
    forming and patterning a first mask layer over the dielectric layer, wherein the forming and the patterning of the first mask layer includes:
        patterning a photo resist material disposed over the first mask layer; and
        etching the first mask layer to transfer a pattern from the patterned photo resist material to the first mask layer such that the etched first mask layer includes an opening extending over a first source/drain fin of the SRAM cell, over a second source/drain fin of the SRAM cell, and over a third source/drain fin of the SRAM cell, wherein the opening extends uninterrupted across the entire SRAM cell along one dimension of the SRAM cell and has a substantially uniform width measured perpendicular to the one dimension;
    thereafter, forming a second mask layer over the dielectric layer;
    etching the dielectric layer using the first mask layer and the second mask layer in combination as an etching mask, wherein a first contact opening and a second contact opening are formed in the dielectric layer from the opening in the etched first mask layer;
wherein the first contact opening extends over and exposes both the first source/drain fin and the third source/drain fin;
forming a first discrete contact plug in the first contact opening electrically connected to the first source/drain fin and the third source/drain fin; and
forming a second discrete contact plug in the second contact opening connected to the second source/drain fin.

2. The method of claim 1, wherein the first mask layer comprises a material selected from the group consisting essentially of a silicon oxide based dielectric, silicon oxynitride, silicon nitride, polysilicon, amorphous silicon, a carbon-containing dielectric material, a nitrogen-containing dielectric material, an organic material, a refractory metal, and combinations thereof.

3. The method of claim 2, wherein the second mask layer comprises a photo resist, and wherein the second mask layer is over the first mask layer.

4. The method of claim 1, wherein after the step of patterning the first mask layer, the first mask layer forms a continuous layer with a first long contact opening therein, wherein the first long contact opening has a longitudinal direction parallel to a long boundary of the SRAM cell, and wherein the first long contact opening has a length greater than or equal to a length of the long boundary.

5. The method of claim 4, wherein the continuous layer further comprises a second long contact opening therein, wherein the second long contact opening has a longitudinal direction parallel to a long boundary of the SRAM cell, and wherein the second long contact opening has a length smaller than the length of the long boundary.

6. The method of claim 5, wherein the second long contact opening extends to a boundary of the SRAM cell.

7. The method of claim 5, wherein the second long contact opening does not extend to any boundary of the SRAM cell.

8. The method of claim 1, wherein after the step of patterning the first mask layer, the first mask layer forms islands that are separated from each other.

9. The method of claim 1, wherein at a time the first discrete contact plug is formed, the second discrete contact plug is formed simultaneous.

10. The method of claim 1, wherein the first discrete contact plug continuously extends over, and interconnects, a drain of the first pull-down transistor and a drain of the first pull-up transistor.

11. A method comprising:
forming a Static Random Access Memory (SRAM) cell comprising a plurality of gate electrodes, and a plurality of active region strips, wherein the plurality of active region strips form transistors with the plurality of gate electrodes;
forming an Inter-Layer Dielectric (ILD) over the plurality of gate electrodes and the plurality of active region strips;
forming a first mask layer over the ILD, wherein the first mask layer covers first portions of the ILD, with second portions of the ILD exposed through openings in the first mask layer, wherein the forming of the first mask layer includes:
forming a resist over the first mask layer;
patterning the resist; and
etching the first mask layer using the patterned resist to form the openings through which the second portions of the ILD are exposed,
wherein the openings include a first opening of the first mask layer disposed over a first active region, a second active region, and a third active region of the plurality of active region strips,
wherein the first opening of the first mask layer extends uninterrupted from a first boundary of the SRAM cell to a second boundary of the SRAM cell opposite the first boundary, and
wherein the first opening has a substantially uniform width measured parallel to the first boundary and the second boundary;
forming a second mask layer, wherein the second mask layer comprises portions filled into parts of the openings in the first mask layer;
etching the ILD using the first mask layer and the second mask layer as an etching mask to form a plurality of contact openings in the ILD, wherein the etching forms a first contact opening and a second contact opening underlying the opening of the first mask layer;
wherein the first contact opening extends over and exposes both the first active region and the third active region; and
forming a plurality of contact plugs in the plurality of contact openings, wherein the plurality of contacts plugs includes:
a first discrete contact plug within the first contact opening and electrically connected to the first active region and the third active region; and
a second discrete contact plug within the second contact opening and electrically connected to the second active region; and
wherein the active regions include source and drain regions of the transistors.

12. The method of claim 11,
wherein the openings in the first mask layer further comprise a second opening overlapping, and having a longitudinal direction parallel to, a third boundary of the SRAM cell, and
wherein the third boundary is perpendicular to the first boundary and the second boundary.

13. The method of claim 12, wherein the second mask layer comprises strips having longitudinal directions perpendicular to the longitudinal direction of the second opening.

14. The method of claim 11, wherein the first mask layer comprises a hard mask material, and the second mask layer comprises a photo resist.

15. The method of claim 11, wherein the step of forming the plurality of contact plugs comprises:
forming the first discrete contact plug over and connected to a drain of a pull-down transistor of the SRAM cell and to a drain of a pull-up transistor of the SRAM cell.

16. A method comprising:
receiving a substrate having a circuit device formed thereupon, wherein the circuit device includes:
a plurality of active regions of a plurality of transistors disposed on the substrate;
a material layer disposed on the substrate;
a first masking layer disposed on the material layer; and
a photoresist disposed on the first masking layer;
patterning the photoresist;
etching the first masking layer to remove a portion of the first masking layer exposed by the patterned photoresist to form a cavity within the first masking layer extending over a first active region, a second active region, and a third active region of the plurality of active regions, wherein the cavity extends uninterrupted from a first cell boundary of the circuit device to an opposing second cell boundary of the circuit device, and wherein the cavity has a substantially uniform width measured parallel to the first cell boundary and the second cell boundary;

forming a second masking layer on the substrate and within the cavity;

patterning the second masking layer;

etching the material layer to remove a portion of the material layer exposed by the etched first masking layer and the patterned second masking layer to form a first contact opening and a second contact opening from the cavity;

wherein the first contact opening extends over and exposes both the first active region and the third active region; and forming a plurality of contact plugs within and extending through the etched material layer, wherein the plurality of contact plugs includes:

a first discrete plug disposed in the first contact opening and electrically coupled to the first active region and the third active region, and a second discrete plug disposed in the second contact opening and coupled to the second active region; and wherein the active regions include source and drain regions of the transistors.

17. The method of claim 16, wherein the circuit device includes an SRAM cell over which the material layer is formed, and wherein the first cell boundary and the second cell boundary are boundaries of the SRAM cell.

18. The method of claim 16, wherein the circuit device defines a standard cell, and wherein the first cell boundary and the second cell boundary are boundaries of the standard cell.

19. The method of claim 17, wherein the first active region corresponds to a first cross-coupled invertor of the SRAM cell, and wherein the second active region corresponds to a second cross-coupled invertor of the SRAM cell.

20. The method of claim 17 wherein the first discrete plug extends over, and is coupled to, a drain of a pull-down transistor of the SRAM cell and a drain of a pull-up transistor of the SRAM cell.

* * * * *